(12) United States Patent
Takahashi et al.

(10) Patent No.: US 11,916,065 B2
(45) Date of Patent: Feb. 27, 2024

(54) SEMICONDUCTOR DEVICE AND METHOD FOR OPERATING SEMICONDUCTOR DEVICE

(71) Applicant: Semiconductor Energy Laboratory Co., Ltd., Atsugi (JP)

(72) Inventors: Kei Takahashi, Isehara (JP); Takeshi Aoki, Ebina (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 391 days.

(21) Appl. No.: 17/425,348

(22) PCT Filed: Feb. 13, 2020

(86) PCT No.: PCT/IB2020/051162
§ 371 (c)(1),
(2) Date: Jul. 23, 2021

(87) PCT Pub. No.: WO2020/174303
PCT Pub. Date: Sep. 3, 2020

(65) Prior Publication Data
US 2022/0102340 A1 Mar. 31, 2022

(30) Foreign Application Priority Data

Feb. 26, 2019 (JP) .................................. 2019-033161
Jul. 2, 2019 (JP) .................................. 2019-123630

(51) Int. Cl.
*H01L 27/06* (2006.01)
*H01L 29/786* (2006.01)
(Continued)

(52) U.S. Cl.
CPC ...... *H01L 27/0629* (2013.01); *H01L 29/7869* (2013.01); *H03F 3/16* (2013.01); *H02J 7/0029* (2013.01)

(58) Field of Classification Search
CPC ............. H01L 27/0629; H01L 29/7869; H01L 27/0266; H01L 27/1207; H01L 29/78648;
(Continued)

(56) References Cited

U.S. PATENT DOCUMENTS 7,005,916 B2   2/2006   Nakahira. et al.
7,215,159 B2   5/2007   Shimizu et al.
(Continued)

FOREIGN PATENT DOCUMENTS

GB   2401497      11/2004
JP   05-122028 A   5/1993
(Continued)

OTHER PUBLICATIONS

International Search Report (Application No. PCT/IB2020/051162) dated May 26, 2020.
Written Opinion (Application No. PCT/IB2020/051162) dated May 26, 2020.

*Primary Examiner* — Yasser A Abdelaziez
(74) *Attorney, Agent, or Firm* — Eric J. Robinson; Robinson Intellectual Property Law Office, P.C.

(57) ABSTRACT

A novel comparison circuit, a novel amplifier circuit, a novel battery control circuit, a novel battery protection circuit, a power storage device, a semiconductor device, an electronic device, and the like are provided. The semiconductor device includes a capacitor, a first amplifier circuit including a first output terminal electrically connected to a first electrode of the capacitor, and a second amplifier circuit including an input terminal, a second output terminal, a first transistor, and a second transistor; a second electrode of the capacitor is electrically connected to the input terminal; the input terminal is electrically connected to a gate of the first transistor and one of a source and a drain of the second transistor; one of a source and a drain of the first transistor is electrically connected to the second output terminal; the
(Continued)

second transistor has a function of supplying a potential to the input terminal and holding the potential; and a channel formation region of the second transistor includes a metal oxide containing at least one of indium and gallium.

6 Claims, 16 Drawing Sheets

(51) Int. Cl.
*H03F 3/16* (2006.01)
*H02J 7/00* (2006.01)

(58) Field of Classification Search
CPC ....... H01L 27/0688; H01L 27/06; H03F 3/16; H03F 2200/174; H03F 2200/18; H03F 1/0261; H03F 2203/45156; H03F 2203/45342; H03F 2203/45544; H03F 2203/7203; H03F 3/45188; H03F 3/72; H03F 3/68; H03F 2200/42; H03F 2203/45618; H03F 2200/522; H03F 1/0211; H02J 7/0029; H03K 5/08
See application file for complete search history.

(56) References Cited

U.S. PATENT DOCUMENTS

| | | | |
|---|---|---|---|
| 8,120,388 | B2 | 2/2012 | Shimizu et al. |
| 8,471,256 | B2* | 6/2013 | Yamazaki ........... H01L 27/1225 |
| | | | 257/E29.117 |
| 2004/0263376 | A1 | 12/2004 | Shimizu et al. |
| 2011/0267726 | A1 | 11/2011 | Ikeuchi et al. |
| 2019/0260203 | A1* | 8/2019 | Seidl ................. H02H 1/0007 |
| 2019/0372534 | A1* | 12/2019 | Seshita ............... H03F 1/0211 |
| 2021/0294367 | A1* | 9/2021 | Takahashi ........... H03F 3/45475 |

FOREIGN PATENT DOCUMENTS

| | | |
|---|---|---|
| JP | 05-175752 A | 7/1993 |
| JP | 2003-304128 A | 10/2003 |
| JP | 2004-312555 A | 11/2004 |
| JP | 2009-071653 A | 4/2009 |
| WO | WO-2020/084398 | 4/2020 |
| WO | WO-2020/104885 | 5/2020 |
| WO | WO-2020/104891 | 5/2020 |

* cited by examiner

SEMICONDUCTOR DEVICE AND METHOD FOR OPERATING SEMICONDUCTOR DEVICE

TECHNICAL FIELD

One embodiment of the present invention relates to a semiconductor device and an operation method of the semiconductor device. One embodiment of the present invention relates to a battery control circuit, a battery protection circuit, a power storage device, and an electronic device.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter. Thus, more specifically, examples of the technical field of one embodiment of the present invention disclosed in this specification include a display device, a light-emitting device, a power storage device, an imaging device, a memory device, a driving method thereof, and a manufacturing method thereof.

BACKGROUND ART

Power storage devices (also referred to as batteries or secondary batteries) have been utilized in a wide range of areas from small electronic devices to automobiles. As the application range of batteries expands, the number of applications each with a multi-cell battery stack where a plurality of battery cells are connected in series increases.

The power storage device is provided with a circuit for detecting an abnormality at charging and discharging, such as overdischarging, overcharging, overcurrent, or a short circuit. In such a circuit performing protection and control of a battery, data of a voltage, a current, and the like is obtained in order to detect the abnormality at charging and discharging. Also in such a circuit, stop of charging and discharging, cell balance, and the like are controlled on the basis of the observed data.

Patent Document 1 discloses a protection IC that functions as a battery protection circuit. Patent Document 1 discloses a protection IC that detects abnormality in charging and discharging by comparing, using a plurality of comparators provided inside, a reference voltage and a voltage of a terminal to which a battery is connected.

In Patent Document 2, a comparator using a field-effect transistor is shown.

REFERENCE

Patent Document

[Patent Document 1] United States Patent Application Publication No. 2011-267726
[Patent Document 2] Japanese Published Patent Application No. 2009-71653

SUMMARY OF THE INVENTION

Problems to be Solved by the Invention

An object of one embodiment of the present invention is to provide a novel comparison circuit, a novel amplifier circuit, a novel battery control circuit, a novel battery protection circuit, a power storage device, a semiconductor device, an electronic device, and the like. Another object of one embodiment of the present invention is to provide a comparison circuit, an amplifier circuit, a battery control circuit, a battery protection circuit, a power storage device, a semiconductor device, an electronic device, and the like that have novel structures and can reduce the power consumption.

Note that the objects of one embodiment of the present invention are not limited to the objects listed above. The objects listed above do not preclude the existence of other objects. Note that the other objects are objects that are not described in this section and are described below. The objects that are not described in this section are derived from the description of the specification, the drawings, and the like and can be extracted as appropriate from the description by those skilled in the art. Note that one embodiment of the present invention is to solve at least one of the objects listed above and/or the other objects.

Means for Solving the Problems

One embodiment of the present invention is a semiconductor device including a first amplifier circuit, a second amplifier circuit, and a capacitor; the first amplifier circuit includes a first output terminal; the second amplifier circuit includes an input terminal, a second output terminal, a first transistor, and a second transistor; the first output terminal is electrically connected to a first electrode of the capacitor; a second electrode of the capacitor is electrically connected to the input terminal; the input terminal of the second amplifier circuit is electrically connected to a gate of the first transistor and one of a source and a drain of the second transistor; one of a source and a drain of the first transistor is electrically connected to the second output terminal; the second amplifier circuit has a function of amplifying a signal supplied to the input terminal and supplying the signal to the second output terminal; the second transistor has a function of supplying a potential to the input terminal and holding the potential; and a channel formation region of the second transistor includes a metal oxide containing at least one of indium and gallium.

Another embodiment of the present invention is a semiconductor device including a first amplifier circuit, a second amplifier circuit, and a capacitor; the first amplifier circuit includes a first output terminal; the second amplifier circuit includes a first transistor, a second transistor, a high potential wiring, a low potential wiring, and a first semiconductor element; the first semiconductor element includes a third electrode and a fourth electrode; the first output terminal is electrically connected to a first electrode of the capacitor; a second electrode of the capacitor is electrically connected to a gate of the first transistor and one of a source and a drain of the second transistor; a channel formation region of the second transistor includes a metal oxide containing at least one of indium and gallium; the third electrode is electrically connected to the high potential wiring; the fourth electrode and one of a source and a drain of the first transistor are electrically connected to the second output terminal; and the other of the source and the drain of the first transistor is electrically connected to the low potential wiring.

In the above structure, it is preferable that the first semiconductor element include a third transistor, the third electrode be electrically connected to one of a source and a drain of the third transistor, and the fourth electrode be electrically connected to the other of the source and the drain of the third transistor.

In the above structure, it is preferable that the first semiconductor element include a plurality of transistors connected in series, the third electrode be electrically connected to a source or a drain of a transistor that is at one end of the plurality of transistors connected in series, and the fourth electrode be electrically connected to a source or a drain of a transistor that is at the other end of the plurality of transistors connected in series.

Another embodiment of the present invention is an operation method of a semiconductor device including a first amplifier circuit, a second amplifier circuit, and a capacitor; the second amplifier circuit includes an input terminal, a second output terminal, and a first transistor; a first output terminal is electrically connected to a first electrode of the capacitor; a second electrode of the capacitor is electrically connected to the input terminal and a gate of the first transistor; one of a source and a drain of the first transistor is electrically connected to the second output terminal. The operation method includes a first step in which a potential V1 is output from the first output terminal, and a potential V2 is supplied to the input terminal; a second step in which the potential V2 of the input terminal is held; and a third step in which a change of a potential output from the first output terminal from the potential V1 to a potential (V1+ΔV1) changes the potential V2 of the input terminal to a potential (V2+ΔV1), and a signal with the amplified potential (V2+ΔV1) is output from the second output terminal.

In the above structure, it is preferable that the second amplifier circuit include a second transistor, the gate of the first transistor be electrically connected to one of a source and a drain of the second transistor, the second transistor be in an on state in the first step, and the first transistor be in an off state in the second step and the third step.

In the above structure, a channel formation region of the second transistor preferably includes a metal oxide containing at least one of indium and gallium.

In the above structure, it is preferable that the first amplifier circuit include a third transistor and a fourth transistor, one of a source and a drain of the third transistor be electrically connected to one of a source and a drain of the fourth transistor, the other of the source and the drain of the fourth transistor be electrically connected to the first output terminal, and in the third step, a potential of the first output terminal be generated in accordance with a comparison result between a potential applied to a gate of the third transistor and a potential applied to a gate of the fourth transistor.

In the above structure, it is preferable that the first amplifier circuit include a fifth transistor and a sixth transistor, a channel formation region of the sixth transistor include a metal oxide containing at least one of indium and gallium, one of a source and a drain of the fifth transistor be electrically connected to the first output terminal, one of a source and a drain of the sixth transistor be electrically connected to a gate of the fifth transistor, the sixth transistor be in an on state in the first step, and the sixth transistor be in an off state in the second step and the third step.

Effect of the Invention

One embodiment of the present invention can provide a novel comparison circuit, a novel amplifier circuit, a novel battery control circuit, a novel battery protection circuit, a power storage device, a semiconductor device, an electronic device, and the like. Another embodiment of the present invention can provide a comparison circuit, an amplifier circuit, a battery control circuit, a battery protection circuit, a power storage device, a semiconductor device, an electronic device, and the like that can reduce the power consumption.

Note that the effects of one embodiment of the present invention are not limited to the effects listed above. The effects listed above do not preclude the existence of other effects. Note that the other effects are effects that are not described in this section and are described below. The effects that are not described in this section are derived from the descriptions of the specification, the drawings, and the like and can be extracted from these descriptions by those skilled in the art. Note that one embodiment of the present invention is to have at least one of the effects listed above and/or the other effects. Accordingly, depending on the case, one embodiment of the present invention does not have the effects listed above in some cases.

MODE FOR CARRYING OUT THE INVENTION

Figure 1A:
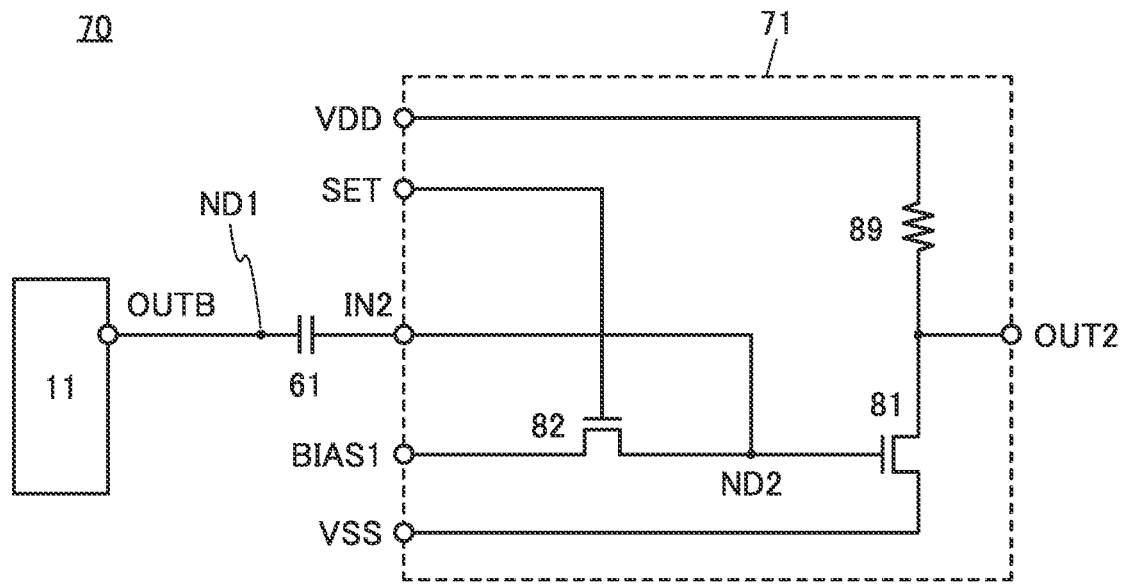
FIG. 1A is a configuration example of a circuit.

Hereinafter, embodiments are described with reference to the drawings. Note that the embodiments can be implemented with many different modes, and it is readily understood by those skilled in the art that modes and details thereof can be changed in various ways without departing from the spirit and scope thereof. Thus, the present invention should not be construed as being limited to the following description of the embodiments.

Note that ordinal numbers such as "first", "second", and "third" in this specification and the like are used in order to avoid confusion among components. Thus, the terms do not limit the number of components. In addition, the terms do not limit the order of components.

Furthermore, in this specification and the like, for example, a "first" component in one embodiment can be referred to as a "second" component in other embodiments or claims. Furthermore, in this specification and the like, for example, a "first" component in one embodiment can be omitted in other embodiments or claims.

Note that in the drawings, the same elements, elements having similar functions, elements formed of the same material, elements formed at the same time, or the like are sometimes denoted by the same reference numerals, and repeated description thereof is omitted in some cases.

In addition, the position, size, range, and the like of each component illustrated in the drawings and the like do not represent the actual position, size, range, and the like in some cases for easy understanding of the invention. Therefore, the disclosed invention is not necessarily limited to the position, size, range, or the like disclosed in drawings and the like. For example, in an actual manufacturing process, a resist mask or the like might be unintentionally reduced in size by treatment such as etching, which is not reflected in some cases for easy understanding.

Furthermore, in a top view (also referred to as a plan view), a perspective view, or the like, the description of some components might be omitted for easy understanding of the drawings.

In addition, in this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

Furthermore, in this specification and the like, a "terminal" refers to a wiring or an electrode connected to a wiring in some cases, for example. Moreover, in this specification and the like, part of a "wiring" is referred to as a "terminal" in some cases.

Note that the term "over" or "under" in this specification and the like does not necessarily mean that a component is placed directly over and in contact with or directly under and in contact with another component. For example, the expression "electrode B over insulating layer A" does not necessarily mean that the electrode B is formed on and in direct contact with the insulating layer A, and does not exclude the case where another component is provided between the insulating layer A and the electrode B.

In addition, functions of a source and a drain are interchanged with each other depending on operation conditions and the like, for example, when a transistor of different polarity is employed or when the current direction is changed in a circuit operation; therefore, it is difficult to define which is the source or the drain. Thus, the terms "source" and "drain" can be interchangeably used in this specification.

In this specification and the like, the expression "electrically connected" includes the case where components are directly connected to each other and the case where components are connected through an "object having any electric function". There is no particular limitation on the "object having any electric function" as long as electric signals can be transmitted and received between components that are connected through the object. Thus, even when the expression "electrically connected" is used, there is a case where no physical connection portion is made and a wiring is just extended in an actual circuit.

Furthermore, in this specification and the like, "parallel" indicates a state where two straight lines are placed at an angle of greater than or equal to $-10°$ and less than or equal to $10°$, for example. Accordingly, the case where the angle is greater than or equal to $-5°$ and less than or equal to $5°$ is also included. Moreover, "perpendicular" and "orthogonal" indicate a state where two straight lines are placed at an angle of greater than or equal to $80°$ and less than or equal to $100°$, for example. Accordingly, the case where the angle is greater than or equal to $85°$ and less than or equal to $95°$ is also included.

In this specification and the like, the terms "identical", "same", "equal", "uniform", and the like used in describing calculation values and measurement values allow for a margin of error of ±20% unless otherwise specified.

Furthermore, in this specification, in the case where an etching treatment is performed after a resist mask is formed, the resist mask is removed after the etching treatment, unless otherwise specified.

In addition, a voltage refers to a potential difference between a certain potential and a reference potential (e.g., a ground potential or a source potential) in many cases. Therefore, the terms "voltage" and "potential" can be replaced with each other in many cases. In this specification and the like, the terms "voltage" and "potential" can be replaced with each other unless otherwise specified.

Note that even a "semiconductor" has characteristics of an "insulator" when conductivity is sufficiently low, for example. Thus, a "semiconductor" can be replaced with an "insulator". In that case, a "semiconductor" and an "insulator" cannot be strictly distinguished from each other because a border therebetween is not clear. Accordingly, a "semiconductor" and an "insulator" described in this specification can be replaced with each other in some cases.

Furthermore, a "semiconductor" has characteristics of a "conductor" when conductivity is sufficiently high, for example. Thus, a "semiconductor" can be replaced with a "conductor". In that case, a "semiconductor" and a "conductor" cannot be strictly distinguished from each other because a border therebetween is not clear. Accordingly, a "semiconductor" and a "conductor" in this specification can be replaced with each other in some cases.

Note that in this specification and the like, an "on state" of a transistor refers to a state in which a source and a drain of the transistor are electrically short-circuited (also referred to as a "conduction state"). Furthermore, an "off state" of the transistor refers to a state in which the source and the drain of the transistor are electrically disconnected (also referred to as a "non-conduction state").

In addition, in this specification and the like, an "on-state current" sometimes refers to a current that flows between a source and a drain when a transistor is in an on state. Furthermore, an "off-state current" sometimes refers to a current that flows between a source and a drain when a transistor is in an off state.

In this specification and the like, a high potential signal refers to a power supply potential at a potential higher than a low potential signal. The low potential signal refers to a power supply potential at a potential lower than the high potential signal. A ground potential can be used as the high potential signal or the low potential signal. For example, in the case where a ground potential is used as the high potential signal, the low potential signal is a potential lower than the ground potential, and in the case where a ground potential is used as the low potential signal, the high potential signal is a potential higher than the ground potential. Furthermore, the high potential signal is referred to as a high power supply potential in some cases. Moreover, the low potential signal is referred to as a low power supply potential in some cases.

In addition, in this specification and the like, a gate refers to part or the whole of a gate electrode and a gate wiring. A gate wiring refers to a wiring for electrically connecting at least one gate electrode of a transistor to another electrode or another wiring.

Furthermore, in this specification and the like, a source refers to part or all of a source region, a source electrode, or a source wiring. A source region refers to a region in a semiconductor layer, where the resistivity is lower than or equal to a given value. A source electrode refers to part of a conductive layer that is connected to a source region. A source wiring refers to a wiring for electrically connecting at least one source electrode of a transistor to another electrode or another wiring.

Moreover, in this specification and the like, a drain refers to part or all of a drain region, a drain electrode, or a drain wiring. A drain region refers to a region in a semiconductor layer, where the resistivity is lower than or equal to a given value. A drain electrode refers to part of a conductive layer that is connected to a drain region. A drain wiring refers to a wiring for electrically connecting at least one drain electrode of a transistor to another electrode or another wiring.

Embodiment 1

In this embodiment, an example of a semiconductor device of one embodiment of the present invention is described.

<Example of Semiconductor Device>

A semiconductor device 70 illustrated in FIG. 1 includes an amplifier circuit 11, a capacitor 61, and an amplifier circuit 71.

The capacitance value of the capacitor 61 is greater than or equal to two times, or greater than or equal to five times that of a transistor 81 described later, for example. Furthermore, the capacitance value of the capacitor 61 is greater than or equal to 100 fF and less than 10 pF, for example.

A terminal OUTB is electrically connected to the amplifier circuit 11. The terminal OUTB is electrically connected to one electrode of the capacitor 61.

A node ND1 is electrically connected to the terminal OUTB and the one electrode of the capacitor 61.

A terminal IN2, a terminal OUT2, a terminal SET, a terminal VDD, a terminal VSS, and a terminal BIAS1 are electrically connected to the amplifier circuit 71. The terminal IN2 is electrically connected to the other electrode of the capacitor.

For example, a high potential signal and a low potential signal are supplied to the terminal VDD and the terminal VSS, respectively. A ground potential may be used as the low potential signal.

The amplifier circuit 71 illustrated in FIG. 1A includes the transistor 81, a transistor 82, and a resistor 89. One of a source and a drain of the transistor 81 is electrically connected to the terminal VSS, and the other is electrically connected to the terminal OUT2 and one electrode of the resistor 89. The other electrode of the resistor 89 is electrically connected to the terminal VDD. One of a source and a drain of the transistor 82 is electrically connected to a gate of the transistor 81 and the terminal IN2, and the other is electrically connected to the terminal BIAS1. The terminal SET is electrically connected to a gate of the transistor 82.

A potential that is obtained by resistance division of a voltage between the terminal VDD and the terminal VSS performed in accordance with the resistance values of the resistor 89 and the transistor 81 is output from the terminal OUT2.

A node ND2 is electrically connected to the terminal IN2, the gate of the transistor 81, and the one of the source and the drain of the transistor 82. When a signal with which the transistor 82 is brought into an on state is supplied from the terminal SET to the gate of the transistor 82, a signal from the terminal BIAS1 is supplied to the node ND2 through the transistor 82.

Supply of a favorable potential to the node ND2 connected to the gate of the transistor 81 can set an operating point (also referred to as a center point of operation in some cases) of the amplifier circuit 71 to a favorable potential, leading to a further increase in gain of the amplifier circuit 71. Furthermore, the output range of the amplifier circuit 71 can be further expanded.

In the semiconductor device of one embodiment of the present invention, use of a transistor including an oxide semiconductor in a channel formation region (hereinafter referred to as an OS transistor) as the transistor 82 can make its off-state current extremely low. Bringing the transistor 82 into an off state enables the node ND2 that has been supplied with a favorable potential to be brought into a floating state. That is, after the supply of the potential to the node ND2, the transistor 82 is brought into an off state so that the supplied potential is held; accordingly, the potential can be programed to the node ND2.

With the node ND2 in a floating state, the potential of the node ND2 is held even when the supply of a signal from the terminal BIAS1 is stopped. At this time, for example, an operating point that is favorable for the amplifier circuit 71 is held in the node ND2. Since the supply of a signal to the terminal BIAS1 can be stopped after the operating point is held in the node ND2, the power consumption of the semiconductor device 70 can be reduced.

Since the node ND2 is in a floating state, due to capacitive coupling with the capacitor 61, the potential of the node ND2 is changed by the amount corresponding to a change in potential of the node ND1 with the held favorable operating point as a center. Thus, the amplifier circuit 71 can be operated at the favorable operating point.

In the semiconductor device of one embodiment of the present invention, a potential that is adjusted in accordance with the characteristics of the amplifier circuit 71 can be supplied from the terminal BIAS1 and can be programed to the node ND2. In the case where a favorable operating point is changed depending on the characteristics of a transistor of the amplifier circuit 71, for example, the potential to be programed can be adjusted to a favorable operating point in accordance with the characteristics of the transistor.

Here, a case where the semiconductor device 70 does not include the capacitor 61 or the transistor 82 is considered. In such a case, for example, a signal from the terminal OUTB is supplied to the gate of the transistor 81, and the operating point of the amplifier circuit 71 becomes an output potential from the terminal OUTB in a state where the amplifier circuit 11 is initialized. In contrast, since the semiconductor device of one embodiment of the present invention includes the capacitor 61 and the transistor 82, the operating point of the amplifier circuit 71 can be set to a desired value.

Figure 1B:
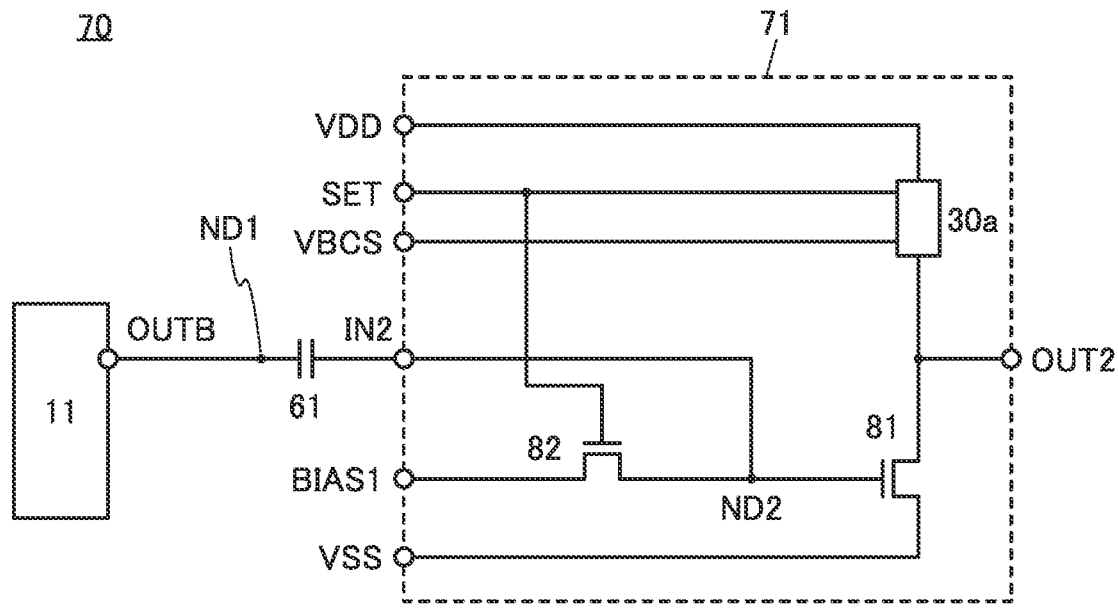
FIG. 1B is a configuration example of a circuit.

The amplifier circuit 71 illustrated in FIG. 1B is different from that illustrated in FIG. 1A in including a circuit 30*a* instead of the resistor 89.

An example of the circuit 30*a* is described with reference to FIG. 1C. The circuit 30*a* includes a transistor 83 and a transistor 84. In the circuit 30*a*, one of a source and a drain of the transistor 83 is electrically connected to the terminal VDD, and the other is electrically connected to the terminal OUT2. One of a source and a drain of the transistor 84 is electrically connected to a gate of the transistor 83, and the other is electrically connected to a terminal VBCS. A gate of the transistor 84 is electrically connected to the terminal SET.

The circuit 30*a* functions as a current source.

The transistors included in the amplifier circuit 71 illustrated in FIG. 1A and FIG. 1B may, but do not necessarily, have back gates.

Figure 2A:
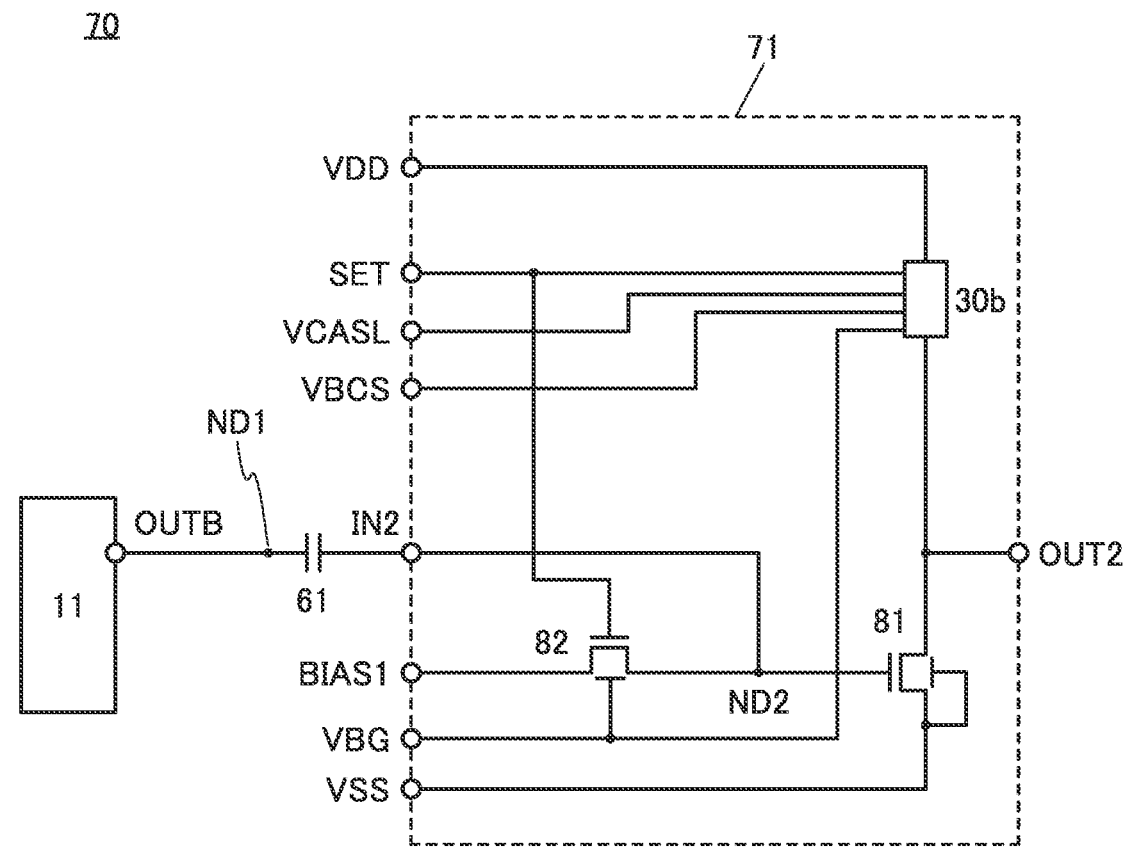
FIG. 2A is a configuration example of a circuit.

The amplifier circuit 71 illustrated in FIG. 2A is different from that illustrated in FIG. 1B in including a circuit 30*b* instead of the circuit 30*a*.

The circuit 30*b* functions as a current source.

Figure 2B:
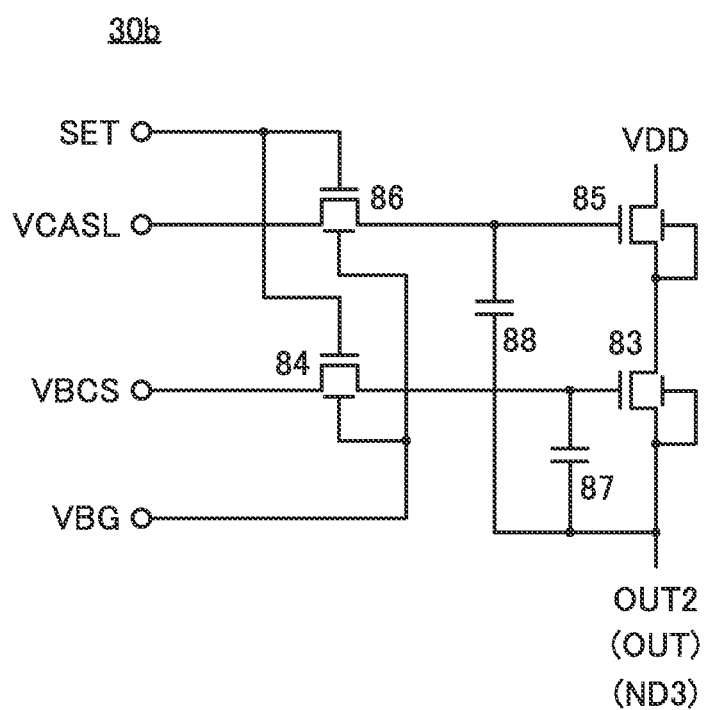
FIG. 2B is a configuration example of a circuit.

As illustrated in FIG. 2B, the circuit 30*b* is different from the circuit 30*a* in including two transistors (the transistor 83 and a transistor 85) connected in series between the terminal VDD and the terminal OUT2. A capacitor 87 is provided between the terminal OUT2 and the gate of the transistor 83, and a capacitor 88 is provided between the terminal OUT2 and a gate of the transistor 85. Furthermore, the circuit 30*b* is not limited to the example illustrated in FIG. 2B, and three or more transistors may be included between the terminal VDD and the terminal OUT2 in the circuit 30*b*.

A voltage between the terminal VDD and the terminal OUT2 is distributed between the source and the drain of the transistor 83 and between a source and a drain of the transistor 85 in accordance with the resistance of each of the transistors. For example, when a voltage between the source and the drain of the transistor 83 is increased, current flowing in the transistor 83 is increased, whereas a voltage between the source and the drain of the transistor 85 is decreased, so that current flowing in the transistor 85 is decreased. One of the transistors operates to control the other of the transistors; thus, the operation of both of the transistors becomes stable. Owing to the stable operation of the transistors, an output signal of the amplifier circuit 71 becomes stable. Moreover, the gain of the amplifier circuit 71 can be increased in some cases.

The details of FIG. 2B are described below. The circuit 30*b* includes the transistor 83, the transistor 84, the transistor 85, a transistor 86, the capacitor 87, and the capacitor 88. The terminal OUT2 is electrically connected to the one of the source and the drain of the transistor 83, the other of the source and the drain of the transistor 83 is electrically connected to one of the source and the drain of the transistor 85, and the other of the source and the drain of the transistor 85 is electrically connected to the terminal VDD. The one of the source and the drain of the transistor 84 is electrically connected to the gate of the transistor 83, and the other is electrically connected to the terminal VBCS. One of a source and a drain of the transistor 86 is electrically connected to the gate of the transistor 85, and the other is electrically connected to a terminal VCASL. The terminal SET is electrically connected to the gate of the transistor 84 and a gate of the transistor 86. One electrode of the capacitor 87 is electrically connected to the terminal OUT2, and the other electrode is electrically connected to the gate of the transistor 83. One electrode of the capacitor 88 is electrically connected to the terminal OUT2, and the other electrode is electrically connected to the gate of the transistor 85.

Owing to the use of OS transistors as the transistor 84 and the transistor 86, when a potential is supplied from the terminal VBCS to the gate of the transistor 83 through the transistor 84 and a potential is supplied from the terminal VCASL to the gate of the transistor 85 through the transistor 86 and then the transistor 84 and the transistor 86 are brought into an off state, the potentials are held in the gate of the transistor 83 and the gate of the transistor 85. Bringing the transistor 84 and the transistor 86 into an off state enables supply of signals to the terminal VBCS and the terminal VCASL to be stopped, and thus the power consumption can be reduced.

Furthermore, as illustrated in FIG. 2A and FIG. 2B, the transistors included in the amplifier circuit 71 may include back gates. When potentials are supplied to the back gates of the transistors, the threshold voltages of the transistors can be controlled.

A back gate of the transistor 82 is electrically connected to a terminal VBG. A back gate of the transistor 81 is electrically connected to the terminal VSS.

Furthermore, as illustrated in FIG. 2B, the transistors included in the circuit 30*b* may have back gates. For example, the one of the source and the drain of the transistor 85 is electrically connected to the terminal VDD, and the other is electrically connected to the back gate of the transistor 85. For example, the back gate of the transistor 83 is electrically connected to the terminal OUT2.

The back gates of the transistor 84 and the transistor 86 are electrically connected to the terminal VBG.

<Polarity of Transistor>

Either an n-channel transistor or a p-channel transistor may be used as transistors included in the amplifier circuit of one embodiment of the present invention, and as illustrated in FIG. 1A, FIG. 1B, FIG. 2A, and FIG. 2B, n-channel transistors may be used as main transistors included in the amplifier circuit 71. In the semiconductor device of one embodiment of the present invention, n-channel transistors can be used as main transistors included in the amplifier circuit, and the amplifier circuit can have high gain and a wide output range.

<Operation Example of Semiconductor Device>

An example of an operation of the semiconductor device 70 is described. In the operation of the semiconductor device 70, the transistor including the gate connected to the terminal SET is brought into an on state at Time t1 and is brought into an off state at Time t2.

At Time t1, a signal is supplied from the terminal SET to the gate of the transistor 82, whereby the transistor 82 is brought into an on state. Accordingly, a signal is supplied from the terminal BIAS1 to the node ND2 through the transistor 82, whereby the potential of the node ND2 becomes the potential V2. A signal is output from the terminal OUTB, and the potential of the node ND1 becomes the potential V1.

At Time t2, a signal is supplied from the terminal SET to the gate of the transistor 82, whereby the transistor 82 is brought into an off state. In the case where an OS transistor is used as the transistor 82, its off-state current is extremely low, and thus the node ND2 is brought into a floating state.

In the case where the potential of the node ND1 is constant, the potential of the node ND2 is also kept substantially constant.

In the case where the potential of the node ND1 changes, due to the capacitive coupling with the capacitor 61, the potential of the node ND2 is changed by the amount corresponding to the change in the potential of the node ND1.

The amplifier circuit 71 can be operated with the potential V2 as the operating point. To set the potential V2 to a favorable value, a favorable signal is supplied from the terminal BIAS1. The potential V2 is adjusted so that the operation region of the transistor 81 becomes favorable, for example. The transistor 81 is operated in a saturation region, for example.

Alternatively, the potential V2 is preferably intermediate between a potential supplied to the terminal VDD and a potential supplied to the terminal VSS.

Setting the potential V2 to a favorable value enables a further increase in the gain of the amplifier circuit 71. Furthermore, the output range of the amplifier circuit 71 can be further expanded.

<Example 2 of Semiconductor Device>

Next, an example of the amplifier circuit 11 is described.

Figure 3A:
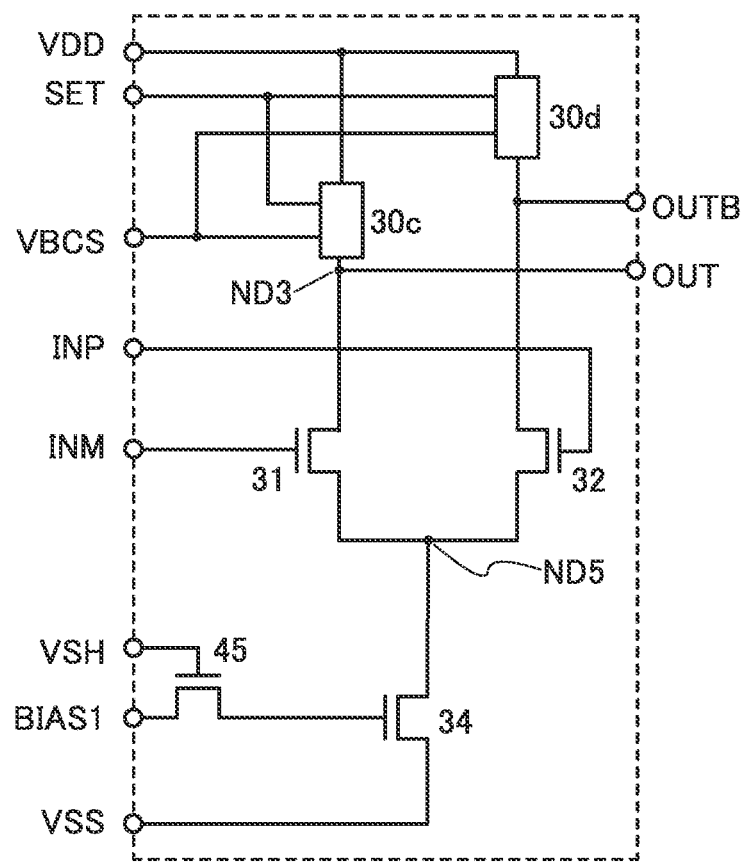
FIG. 3A and FIG. 3B are configuration examples of a circuit.

The amplifier circuit 11 illustrated in FIG. 3A functions as a comparison circuit. A terminal INM and a terminal INP are electrically connected to the amplifier circuit 11. A first input signal is supplied to the terminal INM, a second input signal is supplied to the terminal INP, and an output signal is output from the terminal OUTB. The transistors used in the amplifier circuit 11 may, but do not necessarily, have back gates.

The amplifier circuit 11 includes a transistor 31, a transistor 32, a transistor 34, a transistor 45, a circuit 30c, and a circuit 30d. Furthermore, the terminal VDD, the terminal VSS, the terminal BIAS1, a terminal VSH, the terminal SET, and the terminal VBCS are electrically connected to the amplifier circuit 11. The circuit 30c and the circuit 30d function as a current source.

A gate of the transistor 31 is electrically connected to the terminal INM, and a gate of the transistor 32 is electrically connected to the terminal INP. One of a source and a drain of the transistor 34 is electrically connected to the terminal VSS, and the other is electrically connected to a node ND5. The node ND5 is electrically connected to one of a source and a drain of the transistor 31 and one of a source and a drain of the transistor 32. The other of the source and the drain of the transistor 31 is electrically connected to a node ND3, and the other of the source and the drain of the transistor 32 is electrically connected to the terminal OUTB.

A terminal may be connected to the node ND3 so that the terminal functions as an output terminal.

One of a source and a drain of the transistor 45 is electrically connected to a gate of the transistor 34, and the other is electrically connected to the terminal BIAS1.

A terminal OUT is electrically connected to the node ND3. In the semiconductor device of one embodiment of the present invention, the terminal OUT may be in a floating state, for example. Alternatively, as illustrated in FIG. 3B, in the case where a plurality of stages of the amplifier circuits 11 are connected, the terminal OUT may be connected to the amplifier circuit 11 in the next stage.

Figure 3B:
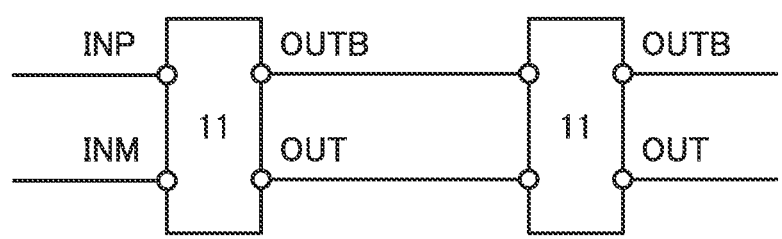

FIG. 3B illustrates an example in which a plurality of stages of the amplifier circuits 11 are connected. Although FIG. 3B illustrates an example in which 2 stages of the amplifier circuits 11 are connected, greater than or equal to 5 and less than or equal to 20 stages, or greater than or equal to 7 and less than or equal to 14 stages of the amplifier circuits 11 may be connected, for example. The terminal OUTB and the terminal OUT that function as the output terminals of the amplifier circuit 11 are electrically connected to input terminals of the amplifier circuit 11 in the next stage. For example, as the input terminals of the amplifier circuit 11 in the next stage, the terminal OUTB and the terminal OUT are electrically connected to the terminal INP and the terminal INM. For example, the terminal OUTB may be connected to one of the terminal INP and the terminal INM, and the terminal OUT may be connected to the other.

Figure 4:
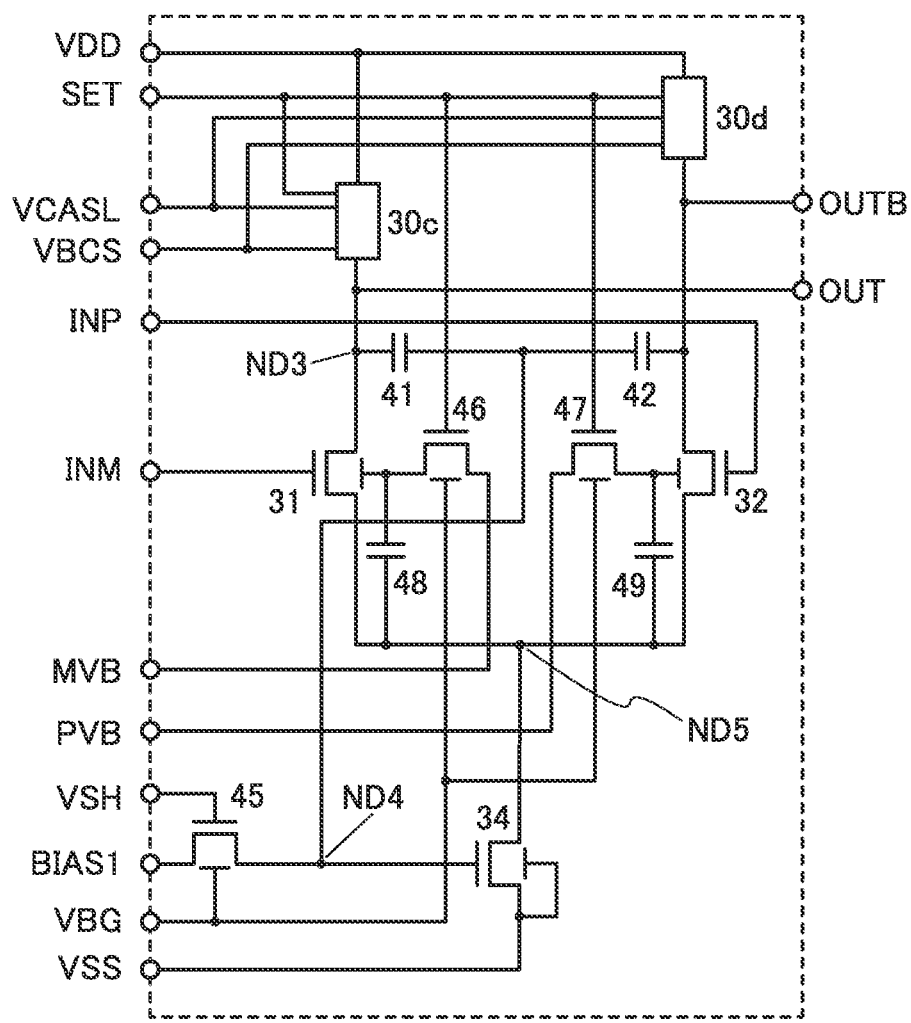
FIG. 4 is a configuration example of a circuit.

The description of the connection in common with that of the amplifier circuit 11 illustrated in FIG. 3A is omitted in FIG. 4.

Figure 1C:
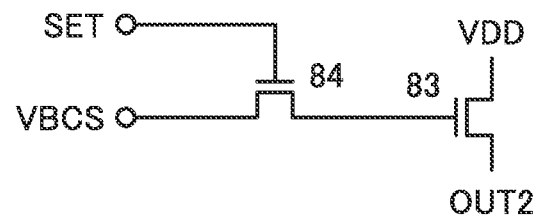
FIG. 1C is a configuration example of a circuit.

All or some of the configurations of the circuit 30a illustrated in FIG. 1C and the circuit 30b illustrated in FIG. 2B can be applied to the circuit 30c and the circuit 30d in FIG. 4. The circuit 30c is placed between the terminal VDD and the transistor 31. The circuit 30d is placed between the terminal VDD and the transistor 32.

The amplifier circuit 11 illustrated in FIG. 4 includes a capacitor 41 and a capacitor 42. One electrode of the capacitor 41 and one electrode of the capacitor 42 are electrically connected to the gate of the transistor 34. The other electrode of the capacitor 41 is electrically connected to the node ND3, and the other electrode of the capacitor 42 is electrically connected to the terminal OUTB. A node ND4 is electrically connected to the gate of the transistor 34. When a potential with which the transistor 45 is brought into an off state, for example, a low potential signal, is supplied to the terminal VSH, the node ND4 is brought into a floating state. The capacitor 41 and the capacitor 42 that are electrically connected to the node ND4 have an effect of inhibiting a change of the node ND4 due to variations in characteristics of the transistor 31 and the transistor 32 to make the operating point of the amplifier circuit 11 stable.

Owing to the use of an OS transistor as the transistor 45, when a potential is supplied to the gate of the transistor 34 and then the transistor 45 is brought into an off state, the potential is held. Supply of a signal to the terminal VSH can be stopped, and thus the power consumption can be reduced.

Furthermore, as illustrated in FIG. 4, the transistors included in the amplifier circuit 11 may have back gates. For example, the back gate of the transistor 34 is electrically connected to the terminal VSS. Moreover, for example, back gates of the transistor 45, a transistor 46, and a transistor 47 are electrically connected to the terminal VBG.

For example, supply of potentials higher than those of the sources of the transistor 31 and the transistor 32 to the back gates thereof can shift the threshold values of the transistor 31 and the transistor 32 in the negative direction. The shift of the threshold values of the transistors in the negative direction enables detection of a lower-level input signal.

The node ND5 is electrically connected to the terminal VSS through the transistor 34. The one of the source and the drain of the transistor 34 is electrically connected to the terminal VSS, and the other is electrically connected to the node ND5.

The back gate of the transistor 31 is connected to the transistor 46 and a capacitor 48 and is supplied with a signal from a terminal MVB through the transistor 46. The terminal SET is electrically connected to gates of the transistor 46 and the transistor 47. One of a source and a drain of the transistor 46 is electrically connected to the terminal MVB, and the other is electrically connected to the back gate of the transistor 31 and one electrode of the capacitor 48. The other electrode of the capacitor 48 is electrically connected to the node ND5.

The back gate of the transistor 32 is connected to the transistor 47 and a capacitor 49 and is supplied with a signal from a terminal PVB through the transistor 47. One of a source and a drain of the transistor 47 is electrically connected to the terminal MVB, and the other is electrically connected to the back gate of the transistor 32 and one electrode of the capacitor 49. The other electrode of the capacitor 49 is electrically connected to the node ND5.

When potentials are supplied to the back gates of the transistor 31 and the transistor 32 and then the transistor 46 and the transistor 47 are brought into an off state, the potential of the back gate of the transistor 31 is held in the capacitor 48 and the potential of the back gate of the transistor 32 is held in the capacitor 49.

Figure 5:
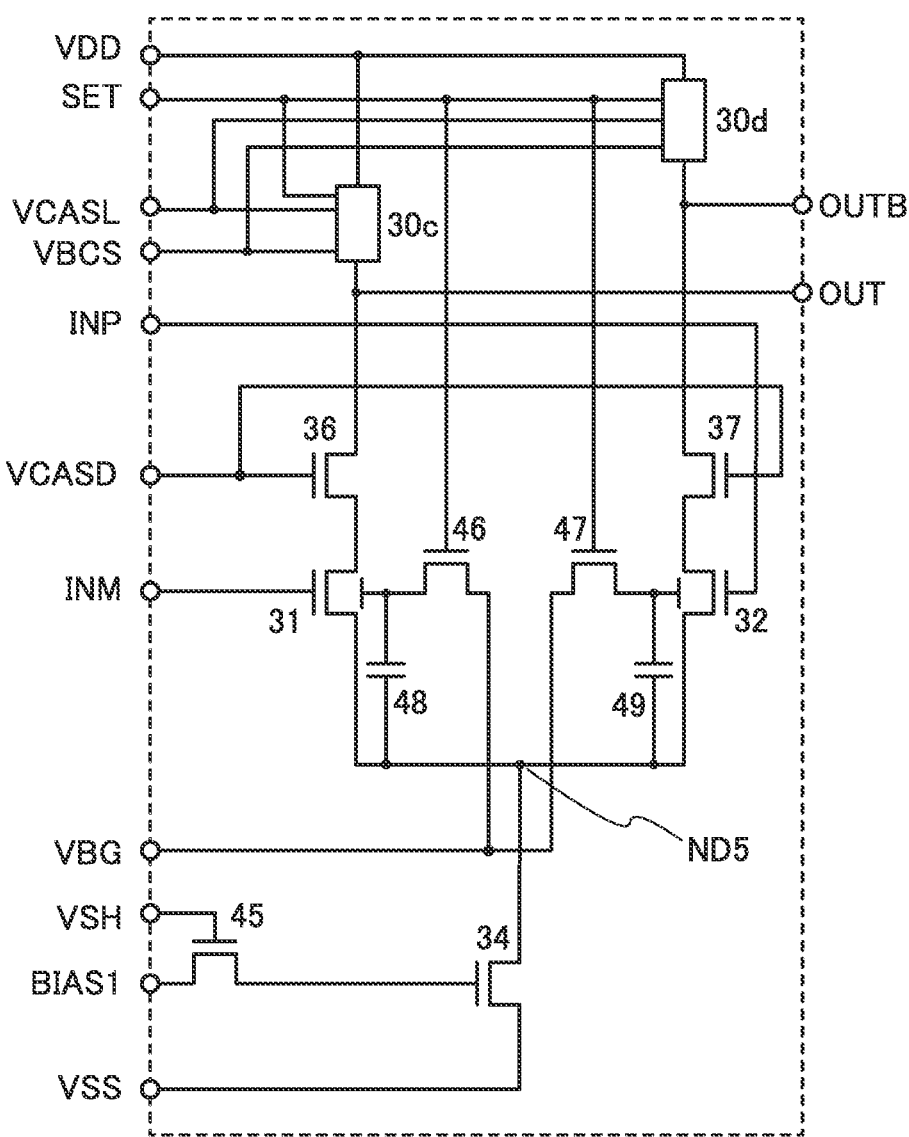
FIG. 5 is a configuration example of a circuit.

FIG. 5 illustrates an example of the amplifier circuit 11. The amplifier circuit 11 illustrated in FIG. 5 is different from the amplifier circuit 11 illustrated in FIG. 4 in including a transistor 36 between the circuit 30c and the transistor 31 and a transistor 37 between the circuit 30d and the transistor 32.

In the amplifier circuit 11 illustrated in FIG. 5, the one of the source and the drain of the transistor 31 is electrically connected to the node ND5, and the other is electrically connected to one of a source and a drain of the transistor 36. The other of the source and the drain of the transistor 36 is electrically connected to the circuit 30c. The one of the source and the drain of the transistor 32 is electrically connected to the node ND5, and the other is electrically connected to one of a source and a drain of the transistor 37. The other of the source and the drain of the transistor 37 is electrically connected to the circuit 30d. Potentials are supplied to gates of the transistor 36 and the transistor 37 from a terminal VCASD.

The transistor 36 and the transistor 37 may include back gates. The back gate of the transistor 36 is electrically connected to, for example, the one of the source and the drain thereof. Alternatively, the back gate of the transistor 36 may be connected to, for example, a terminal to which a desired potential is supplied, and specifically, may be connected to, for example, a terminal such as the terminal VSS or the terminal VBG. The back gate of the transistor 37 is electrically connected to, for example, the one of the source and the drain thereof. Alternatively, the back gate of the transistor 37 may be connected to, for example, a terminal to which a desired potential is supplied, and specifically, may be connected to, for example, a terminal such as the terminal VSS or the terminal VBG.

Although FIG. 5 illustrates the configuration in which the amplifier circuit 11 does not include the capacitor 41 or the capacitor 42 as an example, the amplifier circuit 11 illustrated in FIG. 5 may include the capacitor 41 and the capacitor 42.

Furthermore, although an example in which the transistors 34, 45, 46, and 47 do not include back gates is shown in the amplifier circuit 11 illustrated in FIG. 5, they may include back gates.

A voltage between the terminal OUT and the node ND5 is distributed between the source and the drain of the transistor 36 and between the source and the drain of the transistor 31 in accordance with the resistance of each of the transistors. For example, when a voltage between the source and the drain of the transistor 36 is increased, current flowing in the transistor 36 is increased, whereas a voltage between the source and the drain of the transistor 36 is decreased, so that current flowing in the transistor 31 is decreased. One of the transistors operates to control the other of the transistors; thus, the operation of both of the transistors becomes stable. Owing to the stable operation of the transistors, an output signal of the amplifier circuit 11 becomes stable. Moreover, the gain of the amplifier circuit 11 can be increased in some cases. Similarly, when the transistor 37 and the transistor 32 are respectively substituted for the transistor 36 and the transistor 31 in the above description, one of the transistor 31 and the transistor 32 operates to control the other of the transistors; thus, the operation of both of the transistors becomes stable.

The transistor 46 and the transistor 47 have a function of holding a potential supplied from the terminal VBG. For example, a high potential signal is supplied from the terminal SET to bring the transistor 46 and the transistor 47 into an on state so that a potential from the terminal VBG is supplied to the transistor 31 and the transistor 32, and then a low potential signal is supplied from the terminal SET, whereby the potential from the terminal VBG can be held. The off-state current of an OS transistor is extremely low. Thus, when OS transistors are used as the transistor 46 and the transistor 47, the potential supplied from the terminal VBG can be held for a long time, preferably longer than or equal to one minute, further preferably longer than or equal to one hour, still further preferably longer than or equal to 10 hours.

<Operation Example 2 of Semiconductor Device>

An example of the operation of the semiconductor device 70 including the amplifier circuit 11 is described.

At Time t1, a high potential signal is supplied to the terminal SET to bring the transistors that are connected to the terminal into an on state.

As described above, the potential V2 is supplied from the terminal BIAS1 to the node ND2 through the transistor 82.

Supply of favorable signals to the terminal VBCS, the terminal VCASL, and the like enables the circuit 30a, the circuit 30b, the circuit 30c, the circuit 30d, and the like to function as a current source.

At Time t1, a high potential signal is supplied to the terminal VSH to bring the transistor 45 into an on state. When a favorable signal is supplied to the terminal BIAS1, the signal is supplied to the gate of the transistor 34 through the transistor 45, and the transistor 34 can function as a current source. The transistor 34 is preferably operated in a saturation region, for example.

Substantially the same potentials are input to the terminal INM and the terminal INP. The potential difference between substantially the same potentials is preferably within 20 mV. The potential difference is further preferably within 10 mV. The potential difference is still further preferably within 5 mV.

Next, at Time t2, a low potential signal is supplied to the terminal SET and the terminal VSH.

The transistor 82 is brought into an off state, and the terminal IN2 is brought into a floating state. Furthermore, the transistor 84 and the transistor 86 are brought into an off state, and the gate potential of the transistor 83 and the gate potential of the transistor 85 are brought into a floating state.

Next, at Time t3, two signals that are to be compared are input to the terminal INM and the terminal INP. Here, for example, the potential of the terminal INM at Time t2 is kept being held as a reference value, and the value of the terminal INP is changed. Accordingly, the potential of the node ND1 that is connected to the terminal OUTB is changed. For example, when the potential of the terminal INP is reduced, the potential of the node ND1 is increased, and when the potential of the terminal INP is increased, the potential of the node ND1 is reduced. The node ND2 is in a floating state, and thus due to the capacitive coupling, the potential of the node ND2 is changed by the amount corresponding to the change in the potential of the node ND1.

<Example 3 of Semiconductor Device>

Figure 6A:
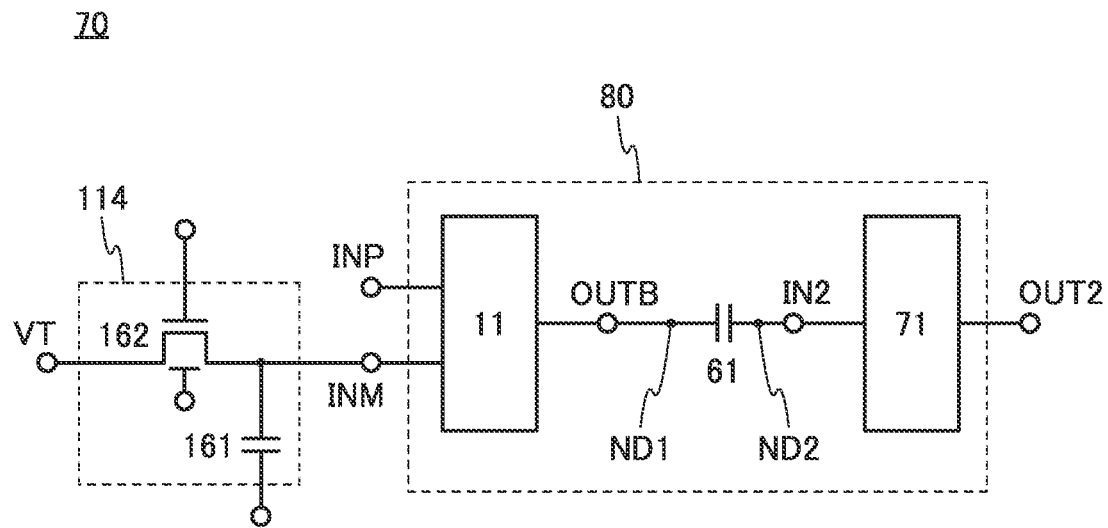
FIG. 6A is a configuration example of a circuit.

FIG. 6A illustrates an example of the semiconductor device of one embodiment of the present invention in which the amplifier circuit of one embodiment of the present invention is used for a comparison circuit (also referred to as a comparator) and a memory element is connected to one of the input terminals of the comparison circuit.

The configuration in which the amplifier circuit 11, the capacitor 61, and the amplifier circuit 71 are connected, which is illustrated in FIG. 1A, FIG. 1B, and FIG. 2A, is hereinafter referred to as an amplifier circuit 80.

The amplifier circuit 80 functions as a comparison circuit including two terminals, which are the terminal INP and the terminal INM that function as input terminals, and the terminal OUT2 that functions as an output terminal. In accordance with the comparison result between the signals input to the terminal INP and the terminal INM, a signal is output from the terminal OUT2. It is preferable that one of the terminal INP and the terminal INM function as a non-inverting input terminal, and the other function as an inverting input terminal.

An example in which the amplifier circuit 80 is used as the comparison circuit is described. A reference signal is supplied to one of the non-inverting input terminal and the inverting input terminal, and a signal to be compared with the reference signal is supplied to the other. FIG. 6A illustrates an example in which the reference signal is supplied to the terminal INM.

Here, the reference signal is preferably held in the memory element. Holding the reference signal in the memory element enables cutting of the connection with a signal supply circuit after the reference signal is supplied from the signal supply circuit. Accordingly, for example, power supply can be stopped in the whole or part of the signal supply circuit.

For the memory element, the configuration of a memory element 114 illustrated in FIG. 6A can be used. The memory element 114 illustrated in FIG. 6A includes a capacitor 161 and a transistor 162. One of a source and a drain of the transistor 162 is electrically connected to the terminal INM, and the reference signal is supplied to the other (a terminal VT in FIG. 6). One electrode of the capacitor 161 is electrically connected to the terminal INM, and a second reference signal, for example, is supplied to the other. Here, as the second reference signal, a ground potential, a low potential signal, a high potential signal, a potential of a positive electrode or a negative electrode of a secondary battery, a value that is obtained by resistance division of a potential between a positive electrode and a negative electrode of a secondary battery, or the like may be used.

An OS transistor is preferably used as the transistor 162. Note that the transistor 162 includes a back gate in FIG. 6A; however, the transistor 162 may have a structure not including a back gate.

An operation example for holding the reference signal in the memory element 114 is shown. First, the transistor 162 is brought into an on state, a signal is supplied to the terminal VT, and a potential corresponding to the signal is supplied to the terminal INM through the transistor 162. Then, the transistor 162 is brought into an off state. When the OS transistor is used as the transistor 162, the off-state current of the transistor 162 can be extremely low. Thus, the potential supplied to the terminal INM can be held.

Figure 6B:
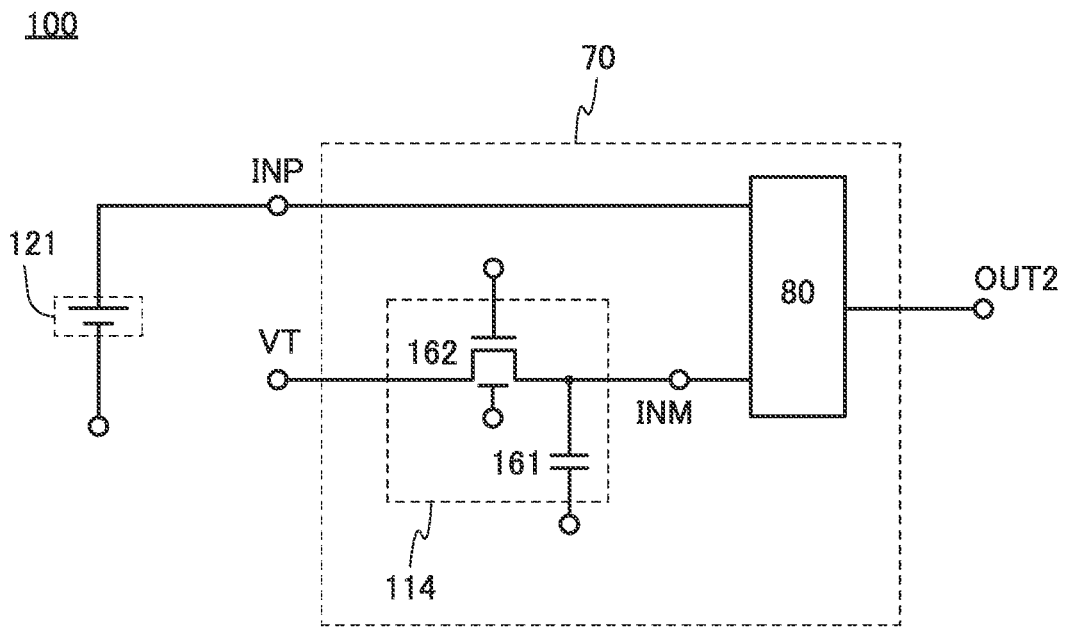
FIG. 6B is a configuration example of a circuit.

FIG. 6B illustrates an example in which the semiconductor device of one embodiment of the present invention is used for a power storage system. A power storage system 100 includes the semiconductor device 70 and a secondary battery 121. A positive electrode of the secondary battery 121 is electrically connected to the terminal INP of the amplifier circuit 80. For example, the upper limit or the lower limit of the voltage region in a range favorable for the positive electrode is held in the terminal INM. A power storage device such as a secondary battery or a capacitor can be used as the secondary battery 121. For example, a lithium-ion secondary battery can be used as the secondary battery 121. The secondary battery is not limited to a lithium-ion secondary battery and as a positive electrode material of the secondary battery, a material containing an element A, an element X, and oxygen can be used, for example. The element A is one or more selected from the Group 1 elements and the Group 2 elements. As a Group 1 element, for example, alkali metal such as lithium, sodium, or potassium can be used. As a Group 2 element, for example, calcium, beryllium, magnesium, or the like can be used. As the element X, for example, one or more selected from metal elements, silicon, and phosphorus can be used. Moreover, the element X is one or more selected from cobalt, nickel, manganese, iron, and vanadium. Typical examples include lithium-cobalt composite oxide $LiCoO_2$ and lithium iron phosphate $LiFePO_4$.

In the case where the upper limit of the voltage region is held in the terminal INM, a signal from the terminal OUT2 is inverted when the potential of the terminal INP becomes higher than the potential of the terminal INM. The inversion of a signal refers to, for example, a change of a high potential signal to a low potential signal or a change of a low potential signal to a high potential signal. Owing to the inversion of the signal, in a circuit to which the output from the terminal OUT2 is supplied, the secondary battery 121 is controlled in accordance with the supplied signal.

<Os Transistor>

An OS transistor includes an oxide semiconductor in a channel formation region. As the oxide semiconductor, a metal oxide containing at least indium or zinc is preferably used. In particular, a metal oxide containing indium and zinc is preferably used. Moreover, gallium, yttrium, tin, or the like is preferably contained in addition to them. Furthermore, one or more kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide that contains indium, an element M, and zinc is considered. The element M is aluminum, gallium, yttrium, or tin. Other elements that can be used as the element M include boron, titanium, iron, nickel, germanium, zirconium, molybdenum, lanthanum, cerium, neodymium, hafnium, tantalum, tungsten, and magnesium. Note that two or more of the above elements may be used in combination as the element M.

The structure and method described in this embodiment can be used by being combined as appropriate with the structures and methods described in the other embodiments.

Embodiment 2

In this embodiment, a structure example of an OS transistor that can be used in the semiconductor device described in the above embodiment is described. Note that an OS transistor is a thin film transistor and can be provided to be stacked; therefore, in this embodiment, a structure example of a semiconductor device in which an OS transistor is provided above a Si transistor formed on a single crystal silicon substrate is described.

<Structure Example 1 of Semiconductor Device>

Figure 7:
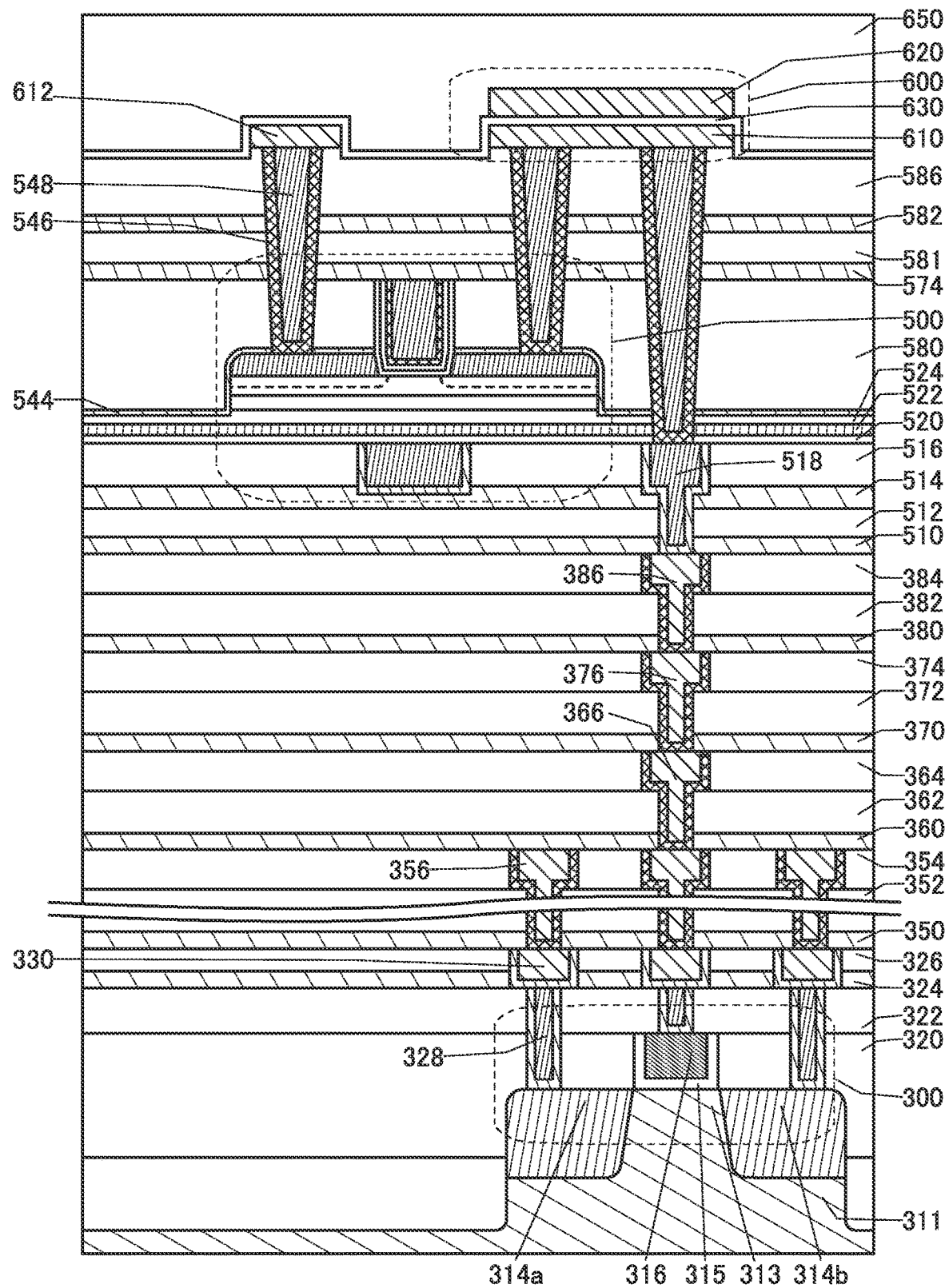
FIG. 7 is a cross-sectional view illustrating a structure example of a semiconductor device.
Figure 8A:
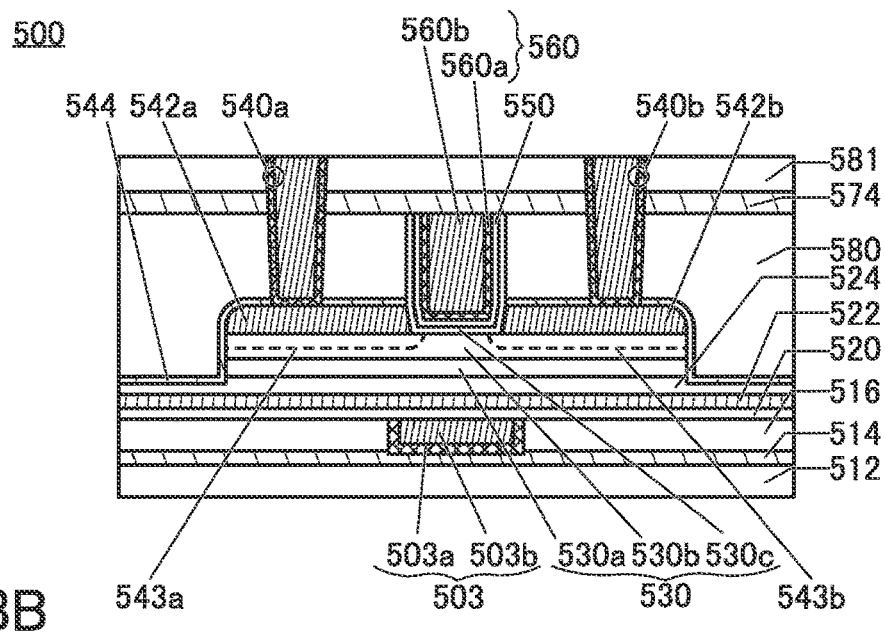
FIG. 8A is a cross-sectional view illustrating a structure example of a transistor.
Figure 8B:
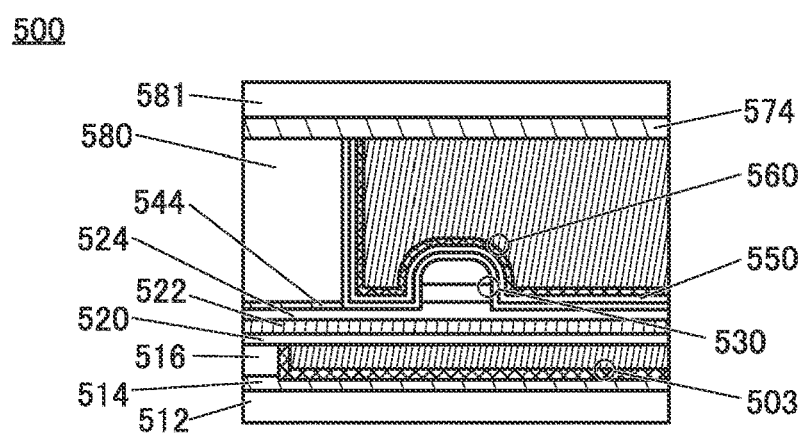
FIG. 8B is a cross-sectional view illustrating a structure example of a transistor.
Figure 8C:
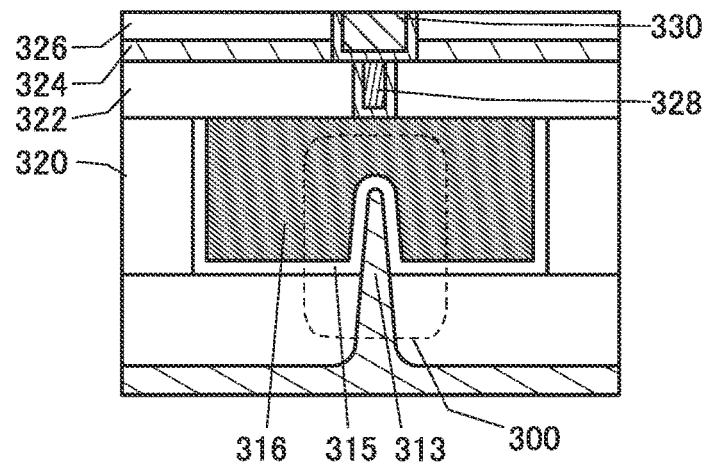
FIG. 8C is a cross-sectional view illustrating a structure example of a transistor.

A semiconductor device illustrated in FIG. 7 includes a transistor 300, a transistor 500, and a capacitor 600. FIG. 8A is a cross-sectional view of the transistor 500 in the channel length direction, FIG. 8B is a cross-sectional view of the transistor 500 in the channel width direction, and FIG. 8C is a cross-sectional view of the transistor 300 in the channel width direction.

The transistor 500 is a transistor including a metal oxide in its channel formation region (an OS transistor). The transistor 500 has extremely low off-state current.

The semiconductor device described in this embodiment includes the transistor 300, the transistor 500, and the capacitor 600 as illustrated in FIG. 7. The transistor 500 is provided above the transistor 300, and the capacitor 600 is provided above the transistor 300 and the transistor 500.

The transistor 300 is provided on a substrate 311 and includes a conductor 316, an insulator 315, a semiconductor region 313 that is a part of the substrate 311, and a low-resistance region 314a and a low-resistance region 314b functioning as a source region and a drain region.

As illustrated in FIG. 8C, in the transistor 300, the top surface and a side surface in the channel width direction of the semiconductor region 313 are covered with the conductor 316 with the insulator 315 therebetween. The effective channel width is increased in the Fin-type transistor 300, whereby the on-state characteristics of the transistor 300 can be improved. In addition, since contribution of an electric field of the gate electrode can be increased, the off-state characteristics of the transistor 300 can be improved.

Note that the transistor 300 can be a p-channel transistor or an n-channel transistor.

It is preferable that a region of the semiconductor region 313 where a channel is formed, a region in the vicinity thereof, the low-resistance region 314a and the low-resistance region 314b functioning as the source region and the drain region, and the like contain a semiconductor such as a silicon-based semiconductor, further preferably single crystal silicon. Alternatively, these regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and thereby changing the lattice spacing is used. Alternatively, the transistor 300 may be an HEMT (High Electron Mobility Transistor) with GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to the semiconductor material used for the semiconductor region 313.

The conductor 316 functioning as a gate electrode can be formed using a semiconductor material such as silicon containing an element that imparts n-type conductivity, such as arsenic or phosphorus, or an element that imparts p-type conductivity, such as boron, or using a conductive material such as a metal material, an alloy material, or a metal oxide material.

Note that since the work function of a conductor depends on a material of the conductor, Vth of the transistor can be adjusted by changing the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Note that the transistor 300 illustrated in FIG. 7 is just an example and the structure is not limited thereto; an appropriate transistor can be used in accordance with a circuit configuration or a driving method.

An insulator 320, an insulator 322, an insulator 324, and an insulator 326 are stacked in this order to cover the transistor 300.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, or aluminum nitride.

The insulator 322 may have a function of a planarization film for planarizing a level difference caused by the transistor 300 or the like provided below the insulator 322. For example, the top surface of the insulator 322 may be planarized by planarization treatment using a chemical mechanical polishing (CMP) method or the like to improve planarity.

The insulator 324 is preferably formed using a film having a barrier property that prevents diffusion of hydrogen or impurities from the substrate 311, the transistor 300, or the like into a region where the transistor 500 is provided.

For the film having a barrier property against hydrogen, silicon nitride formed by a CVD method can be used, for example. Here, the diffusion of hydrogen to a semiconductor element including an oxide semiconductor, such as the transistor 500, degrades the characteristics of the semiconductor element in some cases. Therefore, a film that inhibits hydrogen diffusion is preferably provided between the transistor 500 and the transistor 300. The film that inhibits hydrogen diffusion is specifically a film from which a small amount of hydrogen is released.

The amount of released hydrogen can be measured by thermal desorption spectroscopy (TDS), for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 326 is preferably lower than that of the insulator 324. For example, the relative permittivity of the insulator 326 is preferably lower than 4, further preferably lower than 3. The relative permittivity of the insulator 326 is, for example, preferably 0.7 times or less, further preferably 0.6 times or less the relative permittivity of the insulator 324. When a material with a low relative permittivity is used for an interlayer film, the parasitic capacitance generated between wirings can be reduced.

A conductor 328, a conductor 330, and the like that are connected to the capacitor 600 or the transistor 500 are embedded in the insulator 320, the insulator 322, the insulator 324, and the insulator 326. Note that the conductor 328 and the conductor 330 function as a plug or a wiring. A plurality of conductors functioning as plugs or wirings are collectively denoted by the same reference numeral in some cases. Furthermore, in this specification and the like, a wiring and a plug connected to the wiring may be a single component. That is, there are cases where part of a conductor functions as a wiring and another part of the conductor functions as a plug.

As a material for each of plugs and wirings (the conductor 328, the conductor 330, and the like), a single layer or stacked layers of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to use a low-resistance conductive material such as aluminum or copper. The use of a low-resistance conductive material can reduce wiring resistance.

A wiring layer may be provided over the insulator 326 and the conductor 330. For example, in FIG. 7, an insulator 350, an insulator 352, and an insulator 354 are provided to be stacked in this order. Furthermore, a conductor 356 is formed in the insulator 350, the insulator 352, and the insulator 354. The conductor 356 has a function of a plug or a wiring that is connected to the transistor 300. Note that the conductor 356 can be provided using a material similar to those for the conductor 328 and the conductor 330.

For example, like the insulator 324, the insulator 350 is preferably formed using an insulator having a barrier property against hydrogen. Furthermore, the conductor 356 preferably contains a conductor having a barrier property against hydrogen. In particular, the conductor having a barrier property against hydrogen is formed in an opening of the insulator 350 having a barrier property against hydrogen. With this structure, the transistor 300 and the transistor 500 can be separated by a barrier layer, so that the diffusion of hydrogen from the transistor 300 into the transistor 500 can be inhibited.

Note that as the conductor having a barrier property against hydrogen, tantalum nitride can be used, for example. The use of a stack including tantalum nitride and tungsten having high conductivity can inhibit the diffusion of hydrogen from the transistor 300 while the conductivity of a wiring is kept. In that case, the tantalum nitride layer having a barrier property against hydrogen is preferably in contact with the insulator 350 having a barrier property against hydrogen.

A wiring layer may be provided over the insulator 354 and the conductor 356. For example, in FIG. 7, an insulator 360, an insulator 362, and an insulator 364 are provided to be stacked in this order. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

For example, like the insulator 324, the insulator 360 is preferably formed using an insulator having a barrier property against hydrogen. Furthermore, the conductor 366 preferably contains a conductor having a barrier property against hydrogen. In particular, the conductor having a barrier property against hydrogen is formed in an opening of the insulator 360 having a barrier property against hydrogen. With this structure, the transistor 300 and the transistor 500 can be separated by a barrier layer, so that the diffusion of hydrogen from the transistor 300 into the transistor 500 can be inhibited.

A wiring layer may be provided over the insulator 364 and the conductor 366. For example, in FIG. 7, an insulator 370, an insulator 372, and an insulator 374 are provided to be stacked in this order. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

For example, like the insulator 324, the insulator 370 is preferably formed using an insulator having a barrier property against hydrogen. Furthermore, the conductor 376 preferably contains a conductor having a barrier property against hydrogen. In particular, the conductor having a barrier property against hydrogen is formed in an opening of the insulator 370 having a barrier property against hydrogen. With this structure, the transistor 300 and the transistor 500 can be separated by a barrier layer, so that the diffusion of hydrogen from the transistor 300 into the transistor 500 can be inhibited.

A wiring layer may be provided over the insulator 374 and the conductor 376. For example, in FIG. 7, an insulator 380, an insulator 382, and an insulator 384 are provided to be stacked in this order. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

For example, like the insulator 324, the insulator 380 is preferably formed using an insulator having a barrier property against hydrogen. Furthermore, the conductor 386 preferably contains a conductor having a barrier property against hydrogen. In particular, the conductor having a barrier property against hydrogen is formed in an opening of the insulator 380 having a barrier property against hydrogen. With this structure, the transistor 300 and the transistor 500 can be separated by a barrier layer, so that the diffusion of hydrogen from the transistor 300 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are provided to be stacked in this order over the insulator 384. A substance having a barrier property against oxygen or hydrogen is preferably used for any of the insulator 510, the insulator 512, the insulator 514, and the insulator 516.

For example, the insulator 510 and the insulator 514 are preferably formed using a film having a barrier property that prevents diffusion of hydrogen or impurities from the substrate 311, the region where the transistor 300 is provided, or the like into the region where the transistor 500 is provided. Therefore, a material similar to that for the insulator 324 can be used.

For the film having a barrier property against hydrogen, silicon nitride formed by a CVD method can be used, for example. Here, the diffusion of hydrogen to a semiconductor element including an oxide semiconductor, such as the transistor 500, degrades the characteristics of the semiconductor element in some cases. Therefore, a film that inhibits hydrogen diffusion is preferably provided between the transistor 500 and the transistor 300. The film that inhibits hydrogen diffusion is specifically a film from which a small amount of hydrogen is released.

For the film having a barrier property against hydrogen used as the insulator 510 and the insulator 514, for example, a metal oxide such as aluminum oxide, hafnium oxide, or tantalum oxide is preferably used.

In particular, aluminum oxide has a high blocking effect that inhibits the passage of both oxygen and impurities such as hydrogen and moisture which are factors of a change in electrical characteristics of the transistor. Accordingly, aluminum oxide can prevent the entry of impurities such as hydrogen and moisture into the transistor 500 in the fabrication process and after the fabrication of the transistor. In addition, release of oxygen from the oxide included in the transistor 500 can be inhibited. Therefore, aluminum oxide is suitably used for a protective film of the transistor 500.

The insulator 512 and the insulator 516 can be formed using a material similar to that for the insulator 320, for example. When a material with a relatively low permittivity is used for an interlayer film, the parasitic capacitance between wirings can be reduced. Silicon oxide films, silicon oxynitride films, or the like can be used as the insulator 512 and the insulator 516, for example.

A conductor 518, a conductor included in the transistor 500 (a conductor 503), and the like are embedded in the insulator 510, the insulator 512, the insulator 514, and the insulator 516. Note that the conductor 518 functions as a plug or a wiring that is connected to the capacitor 600 or the transistor 300. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With this structure, the transistor 300 and the transistor 500 can be separated by the layer having a barrier property against oxygen, hydrogen, and water; thus, the diffusion of hydrogen from the transistor 300 into the transistor 500 can be inhibited.

The transistor 500 is provided above the insulator 516.

As illustrated in FIG. 8A and FIG. 8B, the transistor 500 includes the conductor 503 positioned to be embedded in the insulator 514 and the insulator 516; an insulator 520 positioned over the insulator 516 and the conductor 503; an insulator 522 positioned over the insulator 520; an insulator 524 positioned over the insulator 522; an oxide 530a positioned over the insulator 524; an oxide 530b positioned over the oxide 530a; a conductor 542a and a conductor 542b positioned apart from each other over the oxide 530b; an insulator 580 that is positioned over the conductor 542a and the conductor 542b and is provided with an opening formed to overlap with a region between the conductor 542a and the conductor 542b; a conductor 560 positioned in the opening; an insulator 550 positioned between the conductor 560 and the oxide 530b, the conductor 542a, the conductor 542b, and the insulator 580; and an oxide 530c positioned between the insulator 550 and the oxide 530b, the conductor 542a, the conductor 542b, and the insulator 580.

As illustrated in FIG. 8A and FIG. 8B, an insulator 544 is preferably positioned between the insulator 580 and the oxide 530a, the oxide 530b, the conductor 542a, and the conductor 542b. In addition, as illustrated in FIG. 8A and FIG. 8B, the conductor 560 preferably includes a conductor 560a provided inside the insulator 550 and a conductor 560b embedded inside the conductor 560a. Moreover, as illustrated in FIG. 8A and FIG. 8B, an insulator 574 is preferably positioned over the insulator 580, the conductor 560, and the insulator 550.

Hereinafter, the oxide 530a, the oxide 530b, and the oxide 530c may be collectively referred to as an oxide 530. The conductor 542a and the conductor 542b may be collectively referred to as a conductor 542.

The transistor 500 has a structure in which three layers of the oxide 530a, the oxide 530b, and the oxide 530c are stacked in the region where the channel is formed and its vicinity; however, the present invention is not limited thereto. For example, a single layer of the oxide 530b, a two-layer structure of the oxide 530b and the oxide 530a, a two-layer structure of the oxide 530b and the oxide 530c, or a stacked-layer structure of four or more layers may be provided. Although the conductor 560 is shown to have a stacked-layer structure of two layers in the transistor 500, the present invention is not limited thereto. For example, the conductor 560 may have a single-layer structure or a stacked-layer structure of three or more layers. Note that the transistor 500 illustrated in FIG. 7 and FIG. 8A and FIG. 8B is an example, and the structure is not limited thereto; an appropriate transistor can be used in accordance with a circuit configuration or a driving method.

Here, the conductor 560 functions as a gate electrode of the transistor, and the conductor 542a and the conductor 542b function as a source electrode and a drain electrode. As described above, the conductor 560 is formed to be embedded in the opening of the insulator 580 and the region between the conductor 542a and the conductor 542b. The positions of the conductor 560, the conductor 542a, and the conductor 542b are selected in a self-aligned manner with respect to the opening of the insulator 580. That is, in the transistor 500, the gate electrode can be positioned between the source electrode and the drain electrode in a self-aligned manner. Therefore, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542a and the conductor 542b in a self-aligned manner, the conductor 560 does not have a region overlapping with the conductor 542a or the conductor 542b. Thus, parasitic capacitance formed between the conductor 560 and each of the conductor 542a and the conductor 542b can be reduced. As a result, the transistor 500 can have improved switching speed and excellent frequency characteristics.

The conductor 560 sometimes functions as a first gate (also referred to as top gate) electrode. The conductor 503 sometimes functions as a second gate (also referred to as bottom gate) electrode. In that case, Vth of the transistor 500 can be controlled by changing a potential applied to the conductor 503 independently of a potential applied to the conductor 560. In particular, Vth of the transistor 500 can be higher than 0 V and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to be overlapped by the oxide 530 and the conductor 560. Thus, when potentials are applied to the conductor 560 and the conductor 503, an electric field generated from the conductor 560 and an electric field generated from the conductor 503 are connected, so that the channel formation region formed in the oxide 530 can be covered. In this specification and the like, a transistor structure in which a channel formation region is electrically surrounded by electric fields of a first gate electrode and a second gate electrode is referred to as a surrounded channel (S-channel) structure.

Furthermore, in this specification and the like, the S-channel structure has a feature in that the side surface and the vicinity of the oxide 530 in contact with the conductor 542a and the conductor 542b functioning as a source electrode and a drain electrode are of I-type like the channel formation region. The side surface and the vicinity of the oxide 530 in contact with the conductor 542a and the conductor 542b are in contact with the insulator 544 and thus can be of I-type like the channel formation region. Note that in this specification and the like, "I-type" can be equated with "highly purified intrinsic" to be described later. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

The conductor 503 has a structure similar to that of the conductor 518; a conductor 503a is formed in contact with an inner wall of an opening in the insulator 514 and the insulator 516, and a conductor 503b is formed on the inner side.

The insulator 520, the insulator 522, the insulator 524, and the insulator 550 have a function of a gate insulating film.

Here, as the insulator 524 in contact with the oxide 530, an insulator that contains oxygen more than oxygen in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced and the reliability of the transistor 500 can be improved.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably higher than or equal to 100° C. and lower than or equal to 700° C., or higher than or equal to 100° C. and lower than or equal to 400° C.

In the case where the insulator 524 includes an excess-oxygen region, it is preferred that the insulator 522 have a function of inhibiting diffusion of oxygen (e.g., an oxygen atom, an oxygen molecule, or the like) (the oxygen is less likely to pass).

When the insulator 522 has a function of inhibiting diffusion of oxygen or impurities, oxygen contained in the oxide 530 is not diffused to the insulator 520 side, which is preferable. Furthermore, the conductor 503 can be prevented from reacting with oxygen contained in the insulator 524 or the oxide 530.

For example, the insulator 522 is preferably formed using a single layer or stacked layers of an insulator containing what is called a high-k material such as aluminum oxide, hafnium oxide, tantalum oxide, zirconium oxide, lead zirconate titanate (PZT), strontium titanate (SrTiO$_3$), or (Ba, Sr)TiO$_3$ (BST). With miniaturization and high integration of transistors, a problem such as leakage current may arise because of a thinner gate insulating film. When a high-k material is used for an insulator functioning as the gate insulating film, a gate potential during operation of the transistor can be reduced while the physical thickness is maintained.

It is particularly preferable to use an insulator containing an oxide of one or both of aluminum and hafnium, which is an insulating material having a function of inhibiting diffusion of impurities, oxygen, and the like (the oxygen is less likely to pass). As the insulator containing an oxide of one or both of aluminum and hafnium, aluminum oxide, hafnium oxide, an oxide containing aluminum and hafnium (hafnium aluminate), or the like is preferably used. In the case where the insulator 522 is formed using such a material, the insulator 522 functions as a layer that inhibits release of oxygen from the oxide 530 and entry of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

It is preferable that the insulator 520 be thermally stable. For example, silicon oxide and silicon oxynitride, which have thermal stability, are preferable. Furthermore, when an insulator which is a high-k material is combined with silicon oxide or silicon oxynitride, the insulator 520 having a stacked-layer structure that has thermal stability and a high relative permittivity can be obtained.

Note that the insulator 520, the insulator 522, and the insulator 524 may each have a stacked-layer structure of two or more layers. In that case, without limitation to a stacked-layer structure formed of the same material, a stacked-layer structure formed of different materials may be employed.

In the transistor 500, a metal oxide functioning as an oxide semiconductor is preferably used as the oxide 530 including a channel formation region. For example, as the oxide 530, a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. Furthermore, as the oxide 530, an In—Ga oxide or an In—Zn oxide may be used.

Furthermore, a metal oxide with a low carrier concentration is preferably used for the transistor 500. In order to reduce the carrier concentration of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. Examples of impurities in a metal oxide include hydrogen, nitrogen, alkali metal, alkaline earth metal, iron, nickel, and silicon.

In particular, hydrogen contained in a metal oxide reacts with oxygen bonded to a metal atom to be water, and thus forms oxygen vacancies in the metal oxide in some cases. If the channel formation region in the metal oxide includes oxygen vacancies, the transistor sometimes has normally-on characteristics. In some cases, a defect that is an oxygen vacancy into which hydrogen enters functions as a donor and generates an electron serving as a carrier. In other cases, bonding of part of hydrogen to oxygen bonded to a metal atom generates electrons serving as carriers. Thus, a transistor using a metal oxide containing a large amount of hydrogen is likely to have normally-on characteristics.

A defect in which hydrogen has entered an oxygen vacancy can function as a donor of the metal oxide. However, it is difficult to evaluate the defects quantitatively. Thus, the metal oxide is sometimes evaluated by not its donor concentration but its carrier concentration. Therefore, in this specification and the like, the carrier concentration assuming the state where an electric field is not applied is sometimes used, instead of the donor concentration, as the parameter of the metal oxide. That is, "carrier concentration" in this specification and the like can be replaced with "donor concentration" in some cases.

Consequently, when a metal oxide is used for the oxide 530, hydrogen in the metal oxide is preferably reduced as much as possible. Specifically, the hydrogen concentration of the metal oxide, which is measured by secondary ion mass spectrometry (SIMS), is lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$. When a metal oxide with a sufficiently low concentration of impurities such as hydrogen is used for a channel formation region of a transistor, the transistor can have stable electrical characteristics.

When a metal oxide is used for the oxide 530, the carrier concentration of the metal oxide in the channel formation region is preferably lower than or equal to $1 \times 10^{18}$ cm$^{-3}$, further preferably lower than $1 \times 10^{17}$ cm$^{-3}$, further preferably lower than $1 \times 10^{16}$ cm$^{-3}$, further preferably lower than $1 \times 10^{13}$ cm$^{-3}$, further preferably lower than $1 \times 10^{12}$ cm$^{-3}$. Note that the lower limit of the carrier concentration of the metal oxide in the channel formation region is not particularly limited and can be, for example, $1 \times 10^{-9}$ cm$^{-3}$.

When a metal oxide is used for the oxide 530, contact between the conductor 542 (the conductor 542a and the conductor 542b) and the oxide 530 may make oxygen in the oxide 530 diffuse into the conductor 542, resulting in oxidation of the conductor 542. It is highly possible that oxidation of the conductor 542 lowers the conductivity of the conductor 542. Note that diffusion of oxygen in the oxide 530 into the conductor 542 can be interpreted as absorption of oxygen in the oxide 530 by the conductor 542.

When oxygen in the oxide 530 is diffused into the conductor 542 (the conductor 542a and the conductor 542b), a layer is sometimes formed between the conductor 542a and the oxide 530b and between the conductor 542b and the oxide 530b. The layer contains more oxygen than the conductor 542 does, and thus presumably has an insulating property. In this case, a three-layer structure of the conductor 542, the layer, and the oxide 530b can be regarded as a three-layer structure of a metal, an insulator, and a semiconductor and is sometimes referred to as a MIS (Metal-Insulator-Semiconductor) structure or a diode junction structure having an MIS structure as its main part.

The above layer is not necessarily formed between the conductor 542 and the oxide 530b; for example, the layer is sometimes formed between the conductor 542 and the oxide 530c, or the layer is sometimes formed between the conductor 542 and the oxide 530b and between the conductor 542 and the oxide 530c.

The metal oxide functioning as the channel formation region in the oxide 530 has a band gap of preferably 2 eV or higher, further preferably 2.5 eV or higher. With the use of a metal oxide having such a wide band gap, the off-state current of the transistor can be reduced.

When the oxide 530 includes the oxide 530a under the oxide 530b, it is possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c.

Note that the oxide 530 preferably has a stacked-layer structure of a plurality of oxide layers that differ in the atomic ratio of metal atoms. Specifically, the atomic proportion of the element M in constituent elements in the metal oxide used for the oxide 530a is preferably greater than the atomic proportion of the element M in constituent elements in the metal oxide used for the oxide 530b. Moreover, the atomic ratio of the element M to In in the metal oxide used for the oxide 530a is preferably greater than the atomic ratio of the element M to In in the metal oxide used for the oxide 530b. Furthermore, the atomic ratio of In to the element M in the metal oxide used for the oxide 530b is preferably greater than the atomic ratio of In to the element M in the metal oxide used for the oxide 530a. A metal oxide that can be used for the oxide 530a or the oxide 530b can be used for the oxide 530c.

The energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b.

The energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To obtain this, the density of defect states in a mixed layer formed at an interface between the oxide 530a and the oxide 530b and an interface between the oxide 530b and the oxide 530c is preferably made low.

Specifically, when the oxide 530a and the oxide 530b or the oxide 530b and the oxide 530c contain the same element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is preferably used for the oxide 530a and the oxide 530c.

At this time, the oxide 530b serves as a main carrier path. When the oxide 530a and the oxide 530c have the above structure, the density of defect states at the interface between the oxide 530a and the oxide 530b and the interface between the oxide 530b and the oxide 530c can be made low. Thus, the influence of interface scattering on carrier conduction is small, and the transistor 500 can have high on-state current.

The conductor 542 (the conductor 542a and the conductor 542b) functioning as the source electrode and the drain electrode is provided over the oxide 530b. For the conductor 542, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

As illustrated in FIG. 8A, a region 543 (a region 543a and a region 543b) is sometimes formed as a low-resistance region at and near the interface between the oxide 530 and the conductor 542. In that case, the region 543a functions as one of a source region and a drain region, and the region 543b functions as the other of the source region and the drain region. The channel formation region is formed in a region between the region 543a and the region 543b.

When the conductor 542 is provided in contact with the oxide 530, the oxygen concentration in the region 543 sometimes decreases. In addition, a metal compound layer that contains the metal contained in the conductor 542 and the component of the oxide 530 is sometimes formed in the region 543. In such a case, the carrier concentration of the region 543 increases, and the region 543 becomes a low-resistance region.

The insulator 544 is provided to cover the conductor 542 and inhibits oxidation of the conductor 542. At this time, the insulator 544 may be provided to cover a side surface of the oxide 530 and to be in contact with the insulator 524.

A metal oxide containing one or more kinds selected from hafnium, aluminum, gallium, yttrium, zirconium, tungsten, titanium, tantalum, nickel, germanium, magnesium, and the like can be used as the insulator 544.

For the insulator 544, it is particularly preferable to use an insulator containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542 is an oxidation-resistant material or does not significantly lose its conductivity even after absorbing oxygen. Design is appropriately set in consideration of required transistor characteristics.

The insulator 550 functions as a gate insulating film. The insulator 550 is preferably positioned in contact with the inner side (the top surface and the side surface) of the oxide 530c. The insulator 550 is preferably formed using an insulator from which oxygen is released by heating. An oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS analysis is used, for example. Note that the temperature of the film surface in the TDS analysis is preferably higher than or equal to 100° C. and lower than or equal to 700° C.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which have thermal stability, are preferable.

When an insulator from which oxygen is released by heating is provided as the insulator 550 in contact with the top surface of the oxide 530c, oxygen can be efficiently supplied from the insulator 550 to the channel formation region of the oxide 530b through the oxide 530c. Furthermore, as in the insulator 524, the concentration of impurities such as water or hydrogen in the insulator 550 is preferably reduced. The thickness of the insulator 550 is preferably greater than or equal to 1 nm and less than or equal to 20 nm.

To efficiently supply excess oxygen in the insulator 550 to the oxide 530, a metal oxide may be provided between the insulator 550 and the conductor 560. The metal oxide preferably inhibits diffusion of oxygen from the insulator 550 to the conductor 560. Providing the metal oxide that inhibits diffusion of oxygen inhibits diffusion of excess oxygen from the insulator 550 to the conductor 560. That is, a reduction in the amount of excess oxygen supplied to the oxide 530 can be inhibited. Moreover, oxidization of the conductor 560 due to excess oxygen can be inhibited. For the metal oxide, a material that can be used for the insulator 544 is used.

Although the conductor 560 functioning as the first gate electrode has a two-layer structure in FIG. 8A and FIG. 8B, a single-layer structure or a stacked-layer structure of three or more layers may be employed.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 560a has a function of inhibiting oxygen diffusion, it is possible to prevent a reduction in conductivity of the conductor 560b due to oxidation caused by oxygen contained in the insulator 550. As a conductive material having a function of inhibiting oxygen diffusion, for example, tantalum, tantalum nitride, ruthenium, ruthenium oxide, or the like is preferably used.

The conductor 560b is preferably formed using a conductive material containing tungsten, copper, or aluminum as its main component. The conductor 560b also functions as a wiring and thus is preferably formed using a conductor having high conductivity. For example, a conductive material containing tungsten, copper, or aluminum as its main component can be used. The conductor 560b may have a stacked-layer structure, for example, a stacked-layer structure of any of the above conductive materials and titanium or titanium nitride.

The insulator 580 is provided over the conductor 542 with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride, which have thermal stability, are preferable. In particular, silicon oxide and porous silicon oxide, in which an excess-oxygen region can be easily formed in a later step, are preferable.

The insulator 580 preferably includes an excess-oxygen region. When the insulator 580 from which oxygen is released by heating is provided in contact with the oxide 530c, oxygen in the insulator 580 can be efficiently supplied to the oxide 530b through the oxide 530c. Note that the concentration of impurities such as water or hydrogen in the insulator 580 is preferably lowered.

The opening of the insulator 580 is formed to overlap with a region between the conductor 542a and the conductor 542b. Accordingly, the conductor 560 is formed to be embedded in the opening of the insulator 580 and the region between the conductor 542a and the conductor 542b.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; hence, even when the conductor 560 has a shape with a high aspect ratio, the conductor 560 can be formed without collapsing during the process.

The insulator 574 is preferably provided in contact with the top surface of the insulator 580, the top surface of the conductor 560, and the top surface of the insulator 550. When the insulator 574 is deposited by a sputtering method, excess-oxygen regions can be provided in the insulator 550 and the insulator 580. Accordingly, oxygen can be supplied from the excess-oxygen regions to the oxide 530.

For example, a metal oxide containing one or more kinds selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

An insulator 581 functioning as an interlayer film is preferably provided over the insulator 574. As in the insulator 524 or the like, the concentration of impurities such as water or hydrogen in the insulator 581 is preferably lowered.

A conductor 540a and a conductor 540b are positioned in openings formed in the insulator 581, the insulator 574, the insulator 580, and the insulator 544. The conductor 540a and the conductor 540b are provided to face each other with the conductor 560 therebetween. The conductor 540a and the conductor 540b have a structure similar to that of a conductor 546 and that of a conductor 548 described later.

An insulator 582 is provided over the insulator 581. A substance having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has a high blocking effect that inhibits the passage of both oxygen and impurities such as hydrogen and moisture which are factors of a change in electrical characteristics of the transistor. Accordingly, aluminum oxide can prevent the entry of impurities such as hydrogen and moisture into the transistor 500 in the fabrication process and after the fabrication of the transistor. In addition, release of oxygen from the oxide included in the transistor 500 can be inhibited. Therefore, aluminum oxide is suitably used for a protective film of the transistor 500.

An insulator 586 is provided over the insulator 582. For the insulator 586, a material similar to that for the insulator 320 can be used. When a material with a relatively low permittivity is used for an interlayer film, the parasitic capacitance between wirings can be reduced. For example, a silicon oxide film, a silicon oxynitride film, or the like can be used for the insulator 586.

The conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 300. The conductor 546 and the conductor 548 can be provided using a material similar to those for the conductor 328 and the conductor 330.

In addition, the capacitor 600 is provided above the transistor 500. The capacitor 600 includes a conductor 610, a conductor 620, and an insulator 630.

A conductor 612 may be provided over the conductor 546 and the conductor 548. The conductor 612 has a function of a plug or a wiring that is connected to the transistor 500. The conductor 610 has a function of an electrode of the capacitor 600. The conductor 612 and the conductor 610 can be formed at the same time.

The conductor 612 and the conductor 610 can be formed using a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 each of which has a single-layer structure are illustrated in FIG. 7, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 therebetween. The conductor 620 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. In the case where the conductor 620 is formed concurrently with another component such as a conductor, Cu (copper), Al (aluminum), or the like, which is a low-resistance metal material, can be used.

An insulator 650 is provided over the conductor 620 and the insulator 630. The insulator 650 can be provided using a material similar to that for the insulator 320. The insulator 650 may function as a planarization film that covers an uneven shape thereunder.

With the use of this structure, a change in electrical characteristics can be inhibited and reliability can be improved in a semiconductor device using a transistor including an oxide semiconductor. Alternatively, a transistor including an oxide semiconductor and having high on-state current can be provided. Alternatively, a transistor including an oxide semiconductor and having low off-state current can be provided. Alternatively, a semiconductor device with low power consumption can be provided. Alternatively, a semiconductor device using a transistor including an oxide semiconductor can be miniaturized or highly integrated.

<Transistor Structure Examples>

Note that the structure of the transistor 500 in the semiconductor device described in this embodiment is not limited to the above. Examples of structures that can be used for the transistor 500 are described below.

<Transistor Structure Example 1>

Figure 9A:
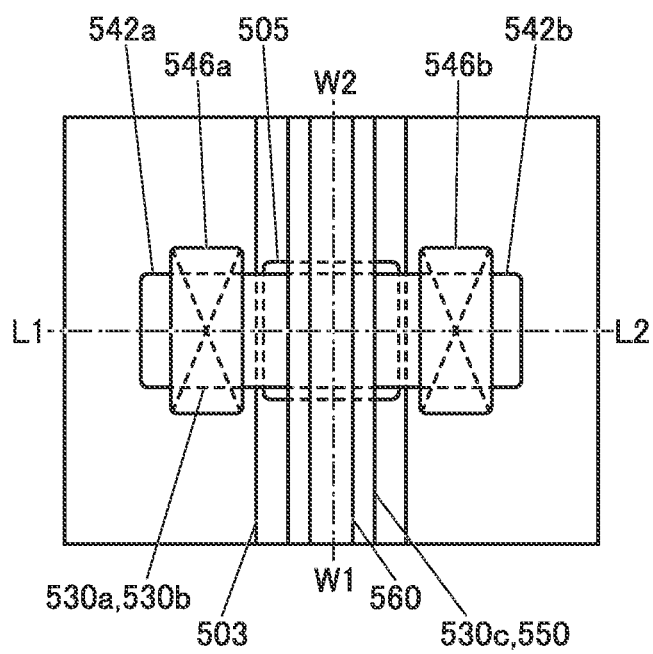
FIG. 9A is a top view illustrating a structure example of a transistor.
Figure 9C:
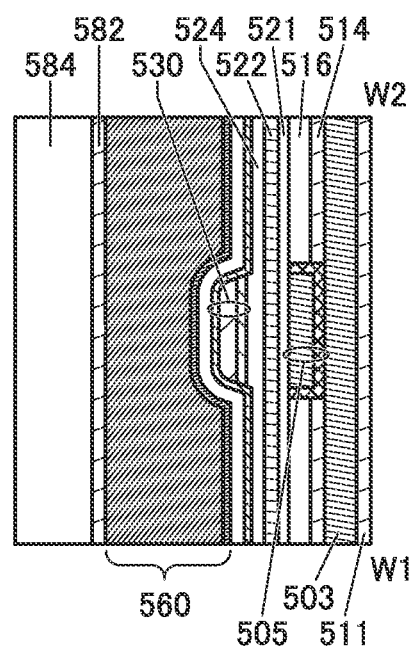
FIG. 9C is a cross-sectional view illustrating a structure example of a transistor.
Figure 9B:
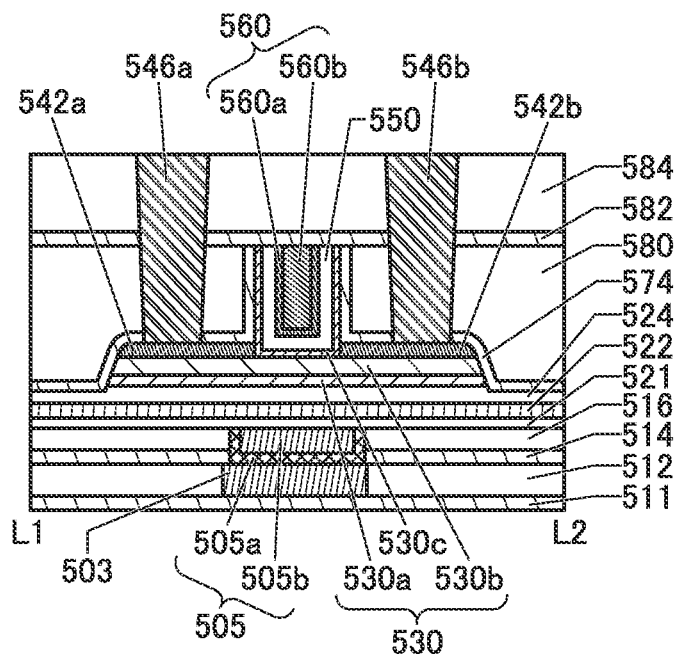
FIG. 9B is a cross-sectional view illustrating a structure example of a transistor.

A structure example of a transistor 510A is described with reference to FIG. 9A, FIG. 9B, and FIG. 9C. FIG. 9A is a top view of the transistor 510A. FIG. 9B is a cross-sectional view of a portion indicated by a dashed-dotted line L1-L2 in FIG. 9A. FIG. 9C is a cross-sectional view of a portion indicated by a dashed-dotted line W1-W2 in FIG. 9A. Note that for clarification of the drawing, some components are not illustrated in the top view of FIG. 9A.

FIG. 9A, FIG. 9B, and FIG. 9C illustrate the transistor 510A and the insulator 511, the insulator 512, the insulator 514, the insulator 516, the insulator 580, the insulator 582, and an insulator 584 that function as interlayer films. In addition, the conductor 546 (a conductor 546a and a conductor 546b) that is electrically connected to the transistor 510A and functions as a contact plug, and the conductor 503 functioning as a wiring are illustrated.

The transistor 510A includes the conductor 560 (the conductor 560a and the conductor 560b) functioning as a first gate electrode; a conductor 505 (a conductor 505a and a conductor 505b) functioning as a second gate electrode; the insulator 550 functioning as a first gate insulating film; an insulator 521, the insulator 522, and the insulator 524 that function as a second gate insulating film; the oxide 530 (the oxide 530a, the oxide 530b, and the oxide 530c) including a region where a channel is formed; the conductor 542a functioning as one of a source and a drain; the conductor 542b functioning as the other of the source and the drain; and the insulator 574.

In the transistor 510A illustrated in FIG. 9A, FIG. 9B, and FIG. 9C, the oxide 530c, the insulator 550, and the conductor 560 are positioned in an opening provided in the insulator 580 with the insulator 574 positioned therebetween. Moreover, the oxide 530c, the insulator 550, and the conductor 560 are positioned between the conductor 542a and the conductor 542b.

The insulator 511 and the insulator 512 function as interlayer films.

As the interlayer film, a single layer or stacked layers of an insulator such as silicon oxide, silicon oxynitride, silicon nitride oxide, aluminum oxide, hafnium oxide, tantalum oxide, zirconium oxide, lead zirconate titanate (PZT), strontium titanate (SrTiO$_3$), or (Ba, Sr)TiO$_3$ (BST) can be used. Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

For example, the insulator 511 preferably functions as a barrier film that inhibits entry of impurities such as water or hydrogen into the transistor 510A from the substrate side. Accordingly, for the insulator 511, it is preferable to use an insulating material that has a function of inhibiting diffusion of impurities such as a hydrogen atom, a hydrogen molecule, a water molecule, and a copper atom (through which the above impurities do not easily pass). Alternatively, it is preferable to use an insulating material that has a function of inhibiting diffusion of oxygen (e.g., at least one of oxygen atoms, oxygen molecules, and the like) (through which the above oxygen does not easily pass). Moreover, aluminum oxide or silicon nitride, for example, may be used for the insulator 511. This structure can inhibit diffusion of impurities such as hydrogen and water to the transistor 510A side from the substrate side of the insulator 511.

For example, the permittivity of the insulator 512 is preferably lower than that of the insulator 511. When a material with a low permittivity is used for the interlayer film, the parasitic capacitance generated between wirings can be reduced.

The conductor 503 is formed to be embedded in the insulator 512. Here, the level of the top surface of the conductor 503 and the level of the top surface of the insulator 512 can be substantially the same. Note that although a structure in which the conductor 503 is a single layer is illustrated, the present invention is not limited thereto. For example, the conductor 503 may have a multilayer structure of two or more layers. Note that for the conductor 503, a conductive material that has high conductivity and contains tungsten, copper, or aluminum as its main component is preferably used.

In the transistor 510A, the conductor 560 sometimes functions as a first gate (also referred to as top gate) electrode. The conductor 505 sometimes functions as a second gate (also referred to as bottom gate) electrode. In that case, the threshold voltage of the transistor 510A can be controlled by changing a potential applied to the conductor 505 independently of a potential applied to the conductor 560. In particular, the threshold voltage of the transistor 510A can be higher than 0 V and the off-state current can be reduced by applying a negative potential to the conductor 505. Thus, drain current at the time when a potential applied to the conductor 560 is 0 V can be lower in the case where a negative potential is applied to the conductor 505 than in the case where a negative potential is not applied to the conductor 505.

For example, when the conductor 505 and the conductor 560 overlap with each other, in the case where a potential is applied to the conductor 560 and the conductor 505, an electric field generated from the conductor 560 and an electric field generated from the conductor 505 are connected and can cover a channel formation region formed in the oxide 530.

That is, the channel formation region can be electrically surrounded by the electric field of the conductor 560 having a function of the first gate electrode and the electric field of the conductor 505 having a function of the second gate electrode. In other words, the transistor has a surrounded channel (S-channel) structure, like the transistor 500 described above.

Like the insulator 511 or the insulator 512, the insulator 514 and the insulator 516 function as interlayer films. For example, the insulator 514 preferably functions as a barrier film that inhibits entry of impurities such as water or hydrogen into the transistor 510A from the substrate side. This structure can inhibit diffusion of impurities such as hydrogen and water to the transistor 510A side from the substrate side of the insulator 514. Moreover, for example, the insulator 516 preferably has a lower permittivity than the insulator 514. When a material with a low permittivity is used for the interlayer film, the parasitic capacitance generated between wirings can be reduced.

In the conductor 505 functioning as the second gate, the conductor 505a is formed in contact with an inner wall of an opening in the insulator 514 and the insulator 516, and the conductor 505b is formed further inside. Here, the top surfaces of the conductor 505a and the conductor 505b and the top surface of the insulator 516 can be substantially level with each other. Although the transistor 510A having a structure in which the conductor 505a and the conductor 505b are stacked is illustrated, the present invention is not limited thereto. For example, the conductor 505 may have a single-layer structure or a stacked-layer structure of three or more layers.

Here, for the conductor 505a, a conductive material that has a function of inhibiting diffusion of impurities such as a hydrogen atom, a hydrogen molecule, a water molecule, and a copper atom (through which the above impurities are less likely to pass) is preferably used. Alternatively, it is preferable to use a conductive material that has a function of inhibiting diffusion of oxygen (e.g., at least one of oxygen atoms, oxygen molecules, and the like) (the above oxygen is less likely to pass). Note that in this specification and the like, a function of inhibiting diffusion of impurities or oxygen means a function of inhibiting diffusion of any one or all of the above impurities and the above oxygen.

For example, when the conductor 505a has a function of inhibiting diffusion of oxygen, a reduction in conductivity of the conductor 505b due to oxidation can be inhibited.

In the case where the conductor 505 doubles as a wiring, the conductor 505b is preferably formed using a conductive material that has high conductivity and contains tungsten, copper, or aluminum as its main component. In that case, the conductor 503 is not necessarily provided. Note that the conductor 505b is illustrated as a single layer but may have a stacked-layer structure, for example, a stack of any of the above conductive materials and titanium or titanium nitride.

The insulator 521, the insulator 522, and the insulator 524 function as a second gate insulating film.

The insulator 522 preferably has a barrier property. The insulator 522 having a barrier property functions as a layer that inhibits entry of impurities such as hydrogen into the transistor 510A from the surroundings of the transistor 510A.

For the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or (Ba, Sr)$TiO_3$ (BST) are preferably used, for example. As miniaturization and high integration of transistors progress, a problem such as leakage current may arise because of a thinner gate insulating film. When a high-k material is used for an insulator functioning as the gate insulating film, a gate potential during operation of the transistor can be reduced while the physical thickness is maintained.

It is preferable that the insulator 521 be thermally stable. For example, silicon oxide and silicon oxynitride, which have thermal stability, are preferable. Furthermore, when an insulator which is a high-k material is combined with silicon oxide or silicon oxynitride, the insulator 521 having a stacked-layer structure that has thermal stability and a high relative permittivity can be obtained.

Note that the second gate insulating film is shown to have a three-layer stacked structure in FIG. 9A, FIG. 9B, and FIG. 9C, but may have a single-layer structure or a stacked-layer structure of two or more layers. In that case, without limitation to a stacked-layer structure formed of the same material, a stacked-layer structure formed of different materials may be employed.

The oxide 530 including a region functioning as the channel formation region includes the oxide 530a, the oxide 530b over the oxide 530a, and the oxide 530c over the oxide 530b. Including the oxide 530a under the oxide 530b makes it possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c. As the oxide 530, the above-described oxide semiconductor, which is one kind of metal oxide, can be used.

Note that the oxide 530c is preferably provided in the opening in the insulator 580 with the insulator 574 positioned therebetween. When the insulator 574 has a barrier property, diffusion of impurities from the insulator 580 into the oxide 530 can be inhibited.

One of the conductor 542a and the conductor 542b functions as a source electrode and the other functions as a drain electrode.

For the conductor 542a and the conductor 542b, a metal such as aluminum, titanium, chromium, nickel, copper, yttrium, zirconium, molybdenum, silver, tantalum, or tungsten or an alloy containing any of the metals as its main component can be used. In particular, a metal nitride film of tantalum nitride or the like is preferable because it has a barrier property against hydrogen or oxygen and its oxidation resistance is high.

Although a single-layer structure is illustrated in FIG. 9A, FIG. 9B, and FIG. 9C, a stacked-layer structure of two or more layers may be employed. For example, a tantalum nitride film and a tungsten film may be stacked. Alternatively, a titanium film and an aluminum film may be stacked. Further alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

A three-layer structure consisting of a titanium film or a titanium nitride film, an aluminum film or a copper film stacked over the titanium film or the titanium nitride film, and a titanium film or a titanium nitride film formed thereover; a three-layer structure consisting of a molybdenum film or a molybdenum nitride film, an aluminum film or a copper film stacked over the molybdenum film or the molybdenum nitride film, and a molybdenum film or a molybdenum nitride film formed thereover; or the like may be employed. Note that a transparent conductive material containing indium oxide, tin oxide, or zinc oxide may be used.

A barrier layer may be provided over the conductor 542. The barrier layer is preferably formed using a material having a barrier property against oxygen or hydrogen. This structure can inhibit oxidation of the conductor 542 at the time of deposition of the insulator 574.

A metal oxide can be used for the barrier layer, for example. In particular, an insulating film of aluminum oxide, hafnium oxide, gallium oxide, or the like, which has a barrier property against oxygen and hydrogen, is preferably used. Alternatively, silicon nitride formed by a CVD method may be used.

With the barrier layer, the range of choices for the material of the conductor 542 can be expanded. For example, a material having a low oxidation resistance and high conductivity, such as tungsten or aluminum, can be used for the conductor 542. Moreover, for example, a conductor that can be easily deposited or processed can be used.

The insulator 550 functions as a first gate insulating film. The insulator 550 is preferably provided in the opening in the insulator 580 with the oxide 530c and the insulator 574 positioned therebetween.

As miniaturization and high integration of transistors progress, a problem such as leakage current may arise because of thinner gate insulating film. In that case, the insulator 550 may have a stacked-layer structure like the second gate insulating film. When the insulator functioning as the gate insulating film has a stacked-layer structure of a high-k material and a thermally stable material, a gate potential during operation of the transistor can be reduced while the physical thickness is maintained. Furthermore, the stacked-layer structure can be thermally stable and have a high relative permittivity.

The conductor 560 functioning as a first gate electrode includes the conductor 560a and the conductor 560b over the conductor 560a. Like the conductor 505a, the conductor 560a is preferably formed using a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of an oxygen atom, an oxygen molecule, and the like).

When the conductor 560a has a function of inhibiting oxygen diffusion, the range of choices for the material of the conductor 560b can be expanded. That is, the conductor 560a inhibits oxidation of the conductor 560b, thereby preventing the decrease in conductivity.

As a conductive material having a function of inhibiting diffusion of oxygen, for example, tantalum, tantalum nitride, ruthenium, or ruthenium oxide is preferably used. For the conductor 560a, the oxide semiconductor that can be used as the oxide 530 can be used. In that case, when the conductor 560b is deposited by a sputtering method, the conductor 560a can have a reduced electric resistance value to be a conductor. This can be referred to as an OC (Oxide Conductor) electrode.

The conductor 560b is preferably formed using a conductive material containing tungsten, copper, or aluminum as its main component. The conductor 560 functions as a wiring and thus is preferably formed using a conductor having high conductivity. For example, a conductive material containing tungsten, copper, or aluminum as its main component can be used. The conductor 560b may have a stacked-layer structure, for example, a stack of any of the above conductive materials and titanium or titanium nitride.

The insulator 574 is positioned between the insulator 580 and the transistor 510A. For the insulator 574, an insulating material having a function of inhibiting diffusion of oxygen and impurities such as water or hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulator 574 can inhibit diffusion of impurities such as water and hydrogen contained in the insulator 580 into the oxide 530b through the oxide 530c and the insulator 550. Furthermore, oxidation of the conductor 560 due to excess oxygen contained in the insulator 580 can be inhibited.

The insulator 580, the insulator 582, and the insulator 584 function as interlayer films.

Like the insulator 514, the insulator 582 preferably functions as a barrier insulating film that inhibits entry of impurities such as water or hydrogen into the transistor 510A from the outside.

Like the insulator 516, the insulator 580 and the insulator 584 preferably have a lower permittivity than the insulator 582. When a material with a low permittivity is used for the interlayer films, the parasitic capacitance generated between wirings can be reduced.

The transistor 510A may be electrically connected to another component through a plug or a wiring such as the conductor 546 embedded in the insulator 580, the insulator 582, and the insulator 584.

As a material for the conductor 546, a conductive material such as a metal material, an alloy material, a metal nitride material, or a metal oxide material can be used as a single layer or stacked layers, as in the conductor 505. For example, it is preferable to use a high-melting-point material that has both heat resistance and conductivity, such as tungsten or molybdenum.

Alternatively, it is preferable to use a low-resistance conductive material such as aluminum or copper. The use of a low-resistance conductive material can reduce wiring resistance.

For example, when the conductor 546 has a stacked-layer structure of tantalum nitride or the like, which is a conductor having a barrier property against hydrogen and oxygen, and tungsten, which has high conductivity, diffusion of impurities from the outside can be inhibited while the conductivity of a wiring is maintained.

With the above structure, a semiconductor device including a transistor that contains an oxide semiconductor and has high on-state current can be provided. Alternatively, a semiconductor device using a transistor that contains an oxide semiconductor and has low off-state current can be provided. Alternatively, a semiconductor device that has small variations in electrical characteristics, stable electrical characteristics, and high reliability can be provided.

<Transistor Structure Example 2>

Figure 10A:
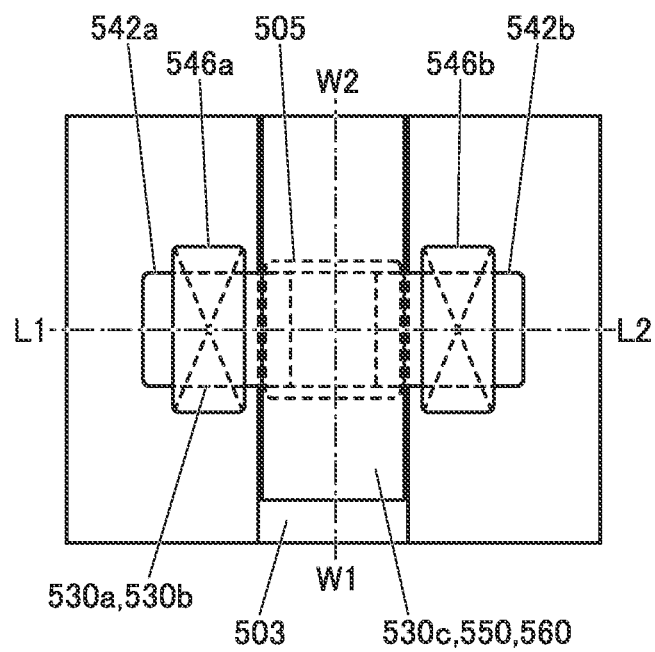
FIG. 10A is a top view illustrating a structure example of a transistor.
Figure 10C:
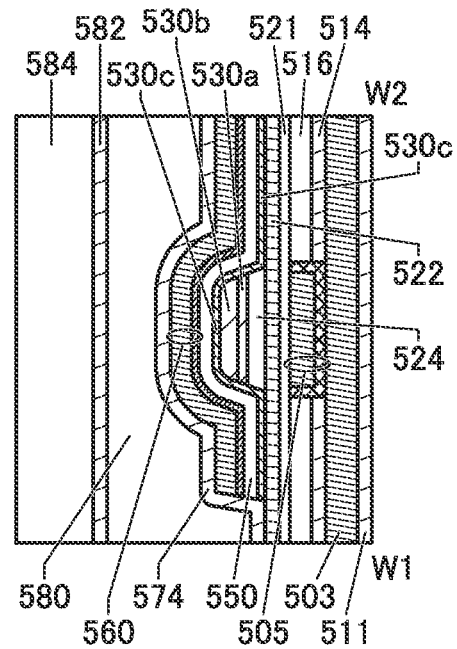
FIG. 10C is a cross-sectional view illustrating a structure example of a transistor.
Figure 10B:
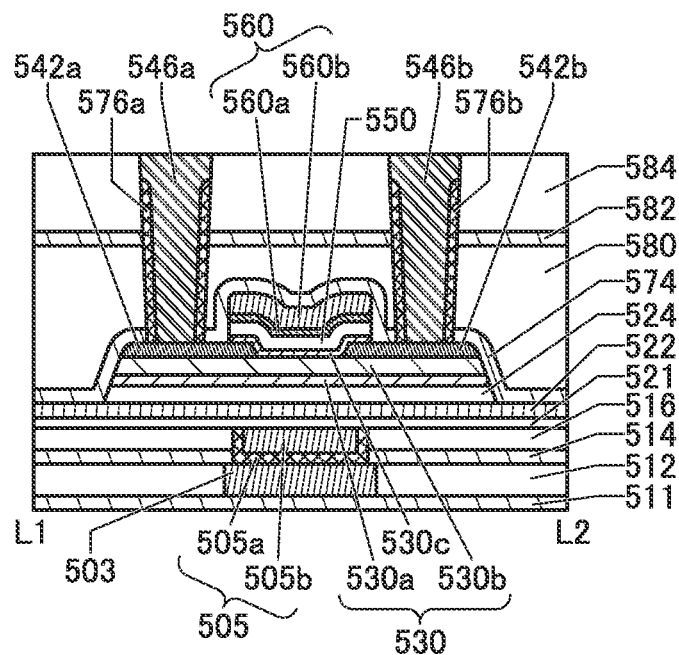
FIG. 10B is a cross-sectional view illustrating a structure example of a transistor.

A structure example of a transistor 510B is described with reference to FIG. 10A, FIG. 10B, and FIG. 10C. FIG. 10A is a top view of the transistor 510B. FIG. 10B is a cross-sectional view of a portion indicated by a dashed-dotted line L1-L2 in FIG. 10A. FIG. 10C is a cross-sectional view of a portion indicated by a dashed-dotted line W1-W2 in FIG. 10A. Note that for clarification of the drawing, some components are not illustrated in the top view of FIG. 10A.

The transistor 510B is a variation example of the transistor 510A. Therefore, differences from the transistor 510A are mainly described to avoid repeated description.

The transistor 510B includes a region where the conductor 542 (the conductor 542a and the conductor 542b), the oxide 530c, the insulator 550, and the conductor 560 overlap with each other. With this structure, a transistor having high on-state current can be provided. Moreover, a transistor having high controllability can be provided.

The conductor 560 functioning as a first gate electrode includes the conductor 560a and the conductor 560b over the conductor 560a. Like the conductor 505a, the conductor 560a is preferably formed using a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of an oxygen atom, an oxygen molecule, and the like).

When the conductor 560a has a function of inhibiting oxygen diffusion, the range of choices for the material of the conductor 560b can be expanded. That is, the conductor 560a inhibits oxidation of the conductor 560b, thereby preventing the decrease in conductivity.

The insulator 574 is preferably provided to cover the top surface and a side surface of the conductor 560, a side surface of the insulator 550, and the side surface of the oxide 530c. For the insulator 574, an insulating material having a function of inhibiting diffusion of oxygen and impurities such as water or hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulator 574 can inhibit oxidation of the conductor 560. Moreover, the insulator 574 can inhibit diffusion of impurities such as water and hydrogen contained in the insulator 580 into the transistor 510B.

An insulator 576 (an insulator 576a and an insulator 576b) having a barrier property may be provided between the conductor 546 and the insulator 580. Providing the insulator 576 can prevent oxygen in the insulator 580 from reacting with the conductor 546 and oxidizing the conductor 546.

Furthermore, with the insulator 576 having a barrier property, the range of choices for the material of the conductor used as the plug or the wiring can be expanded. The use of a metal material having an oxygen absorbing property and high conductivity for the conductor 546, for example, can provide a semiconductor device with low power consumption. Specifically, a material having a low oxidation resistance and high conductivity, such as tungsten or aluminum, can be used. Moreover, for example, a conductor that can be easily deposited or processed can be used.

<Transistor Structure Example 3>

Figure 11A:
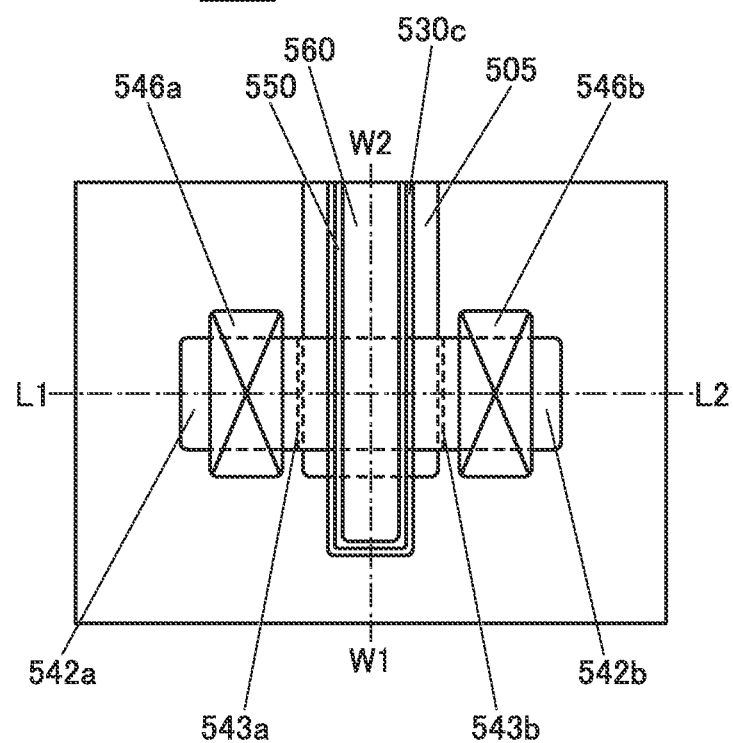
FIG. 11A is a top view illustrating a structure example of a transistor.
Figure 11C:
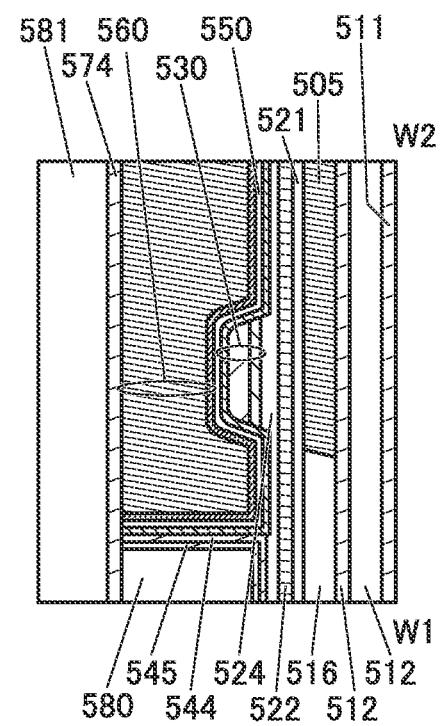
FIG. 11C is a cross-sectional view illustrating a structure example of a transistor.
Figure 11B:
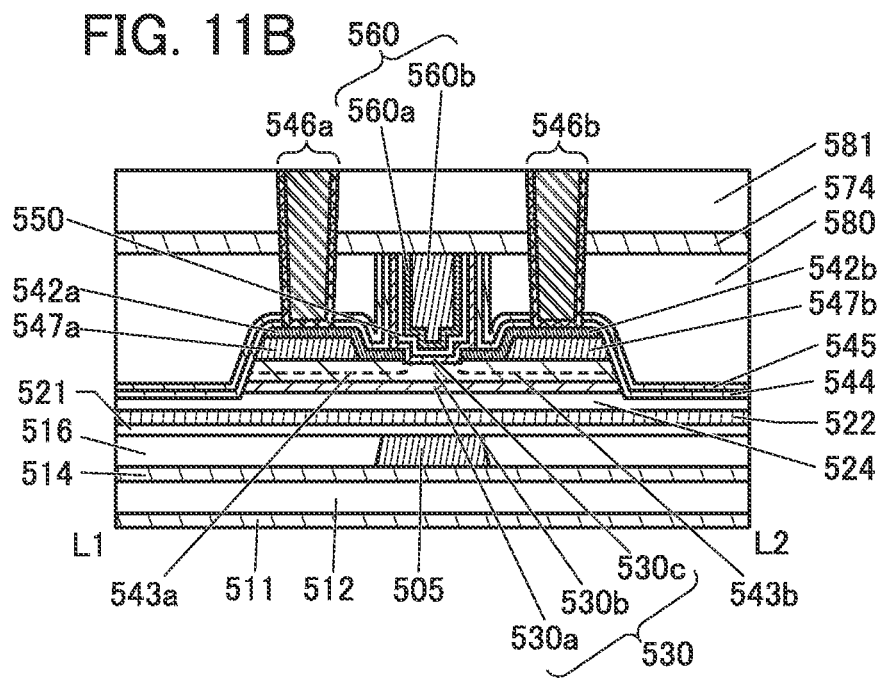
FIG. 11B is a cross-sectional view illustrating a structure example of a transistor.

A structure example of a transistor 510C is described with reference to FIG. 11A, FIG. 11B, and FIG. 11C. FIG. 11A is a top view of the transistor 510C. FIG. 11B is a cross-sectional view of a portion indicated by a dashed-dotted line L1-L2 in FIG. 11A. FIG. 11C is a cross-sectional view of a portion indicated by a dashed-dotted line W1-W2 in FIG. 11A. Note that for clarification of the drawing, some components are not illustrated in the top view of FIG. 11A.

The transistor 510C is a variation example of the transistor 510A. Therefore, differences from the transistor 510A are mainly described to avoid repeated description.

In the transistor 510C illustrated in FIG. 11A, FIG. 11B, and FIG. 11C, a conductor 547a is positioned between the conductor 542a and the oxide 530b and a conductor 547b is positioned between the conductor 542b and the oxide 530b. Here, the conductor 542a (the conductor 542b) has a region that extends beyond the top surface and a side surface on the conductor 560 side of the conductor 547a (the conductor 547b) and is in contact with the top surface of the oxide 530b. For the conductor 547, a conductor that can be used for the conductor 542 is used. It is preferred that the thickness of the conductor 547 be at least greater than that of the conductor 542.

In the transistor 510C illustrated in FIG. 11A, FIG. 11B, and FIG. 11C, because of the above structure, the conductor 542 can be closer to the conductor 560 than in the transistor 510A. Alternatively, the conductor 560 and an end portion of the conductor 542a and an end portion of the conductor 542b can overlap with each other. Accordingly, the effective channel length of the transistor 510C can be shortened, and the on-state current and the frequency characteristics can be improved.

The conductor 547a (the conductor 547b) is preferably provided to be overlapped by the conductor 542a (the conductor 542b). With such a structure, the conductor 547a (the conductor 547b) can function as a stopper to prevent over-etching of the oxide 530b in etching for forming the opening in which the conductor 546a (the conductor 546b) is to be embedded.

The transistor 510C illustrated in FIG. 11A, FIG. 11B, and FIG. 11C may have a structure in which an insulator 545 is positioned on and in contact with the insulator 544. The insulator 544 preferably functions as a barrier insulating film that inhibits entry of impurities such as water or hydrogen and excess oxygen into the transistor 510C from the insulator 580 side. The insulator 544 can be formed using an insulator that can be used for the insulator 545. In addition, the insulator 544 may be formed using a nitride insulator such as aluminum nitride, aluminum titanium nitride, titanium nitride, silicon nitride, or silicon nitride oxide, for example.

Unlike in the transistor 510A illustrated in FIG. 9A, FIG. 9B, and FIG. 9C, in the transistor 510C illustrated in FIG. 11A, FIG. 11B, and FIG. 11C, the conductor 505 may be provided to have a single-layer structure. In this case, an insulating film to be the insulator 516 is formed over the patterned conductor 505, and an upper portion of the insulating film is removed by a CMP method or the like until the top surface of the conductor 505 is exposed. Preferably, the planarity of the top surface of the conductor 505 is made favorable. For example, the average surface roughness (Ra) of the top surface of the conductor 505 is less than or equal to 1 nm, preferably less than or equal to 0.5 nm, further preferably less than or equal to 0.3 nm. This allows the improvement in planarity of an insulating layer formed over the conductor 505 and the increase in crystallinity of the oxide 530b and the oxide 530c.

<Transistor Structure Example 4>

Figure 12A:
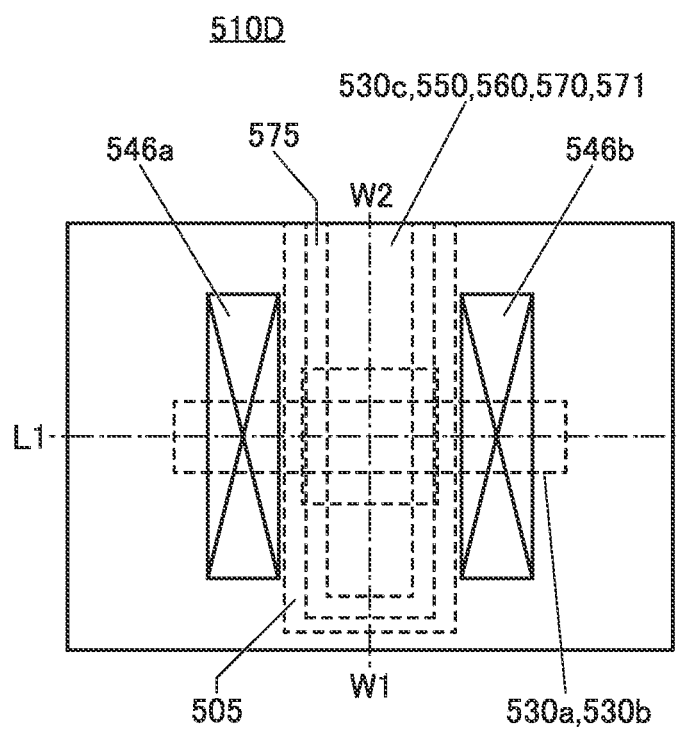
FIG. 12A is a top view illustrating a structure example of a transistor.
Figure 12C:
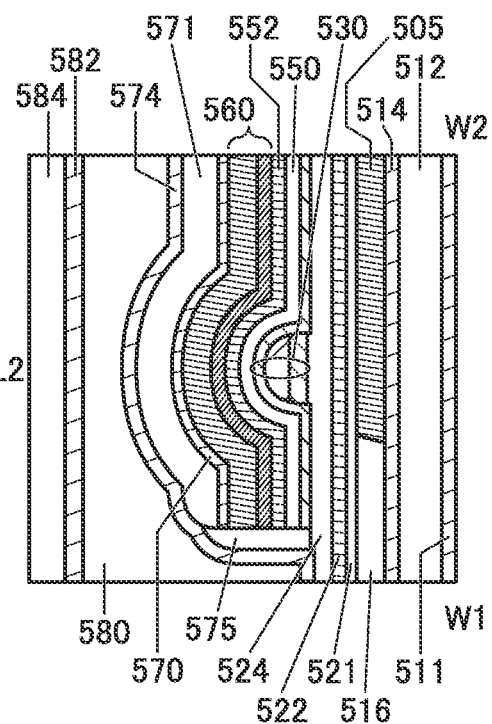
FIG. 12C is a cross-sectional view illustrating a structure example of a transistor.
Figure 12B:
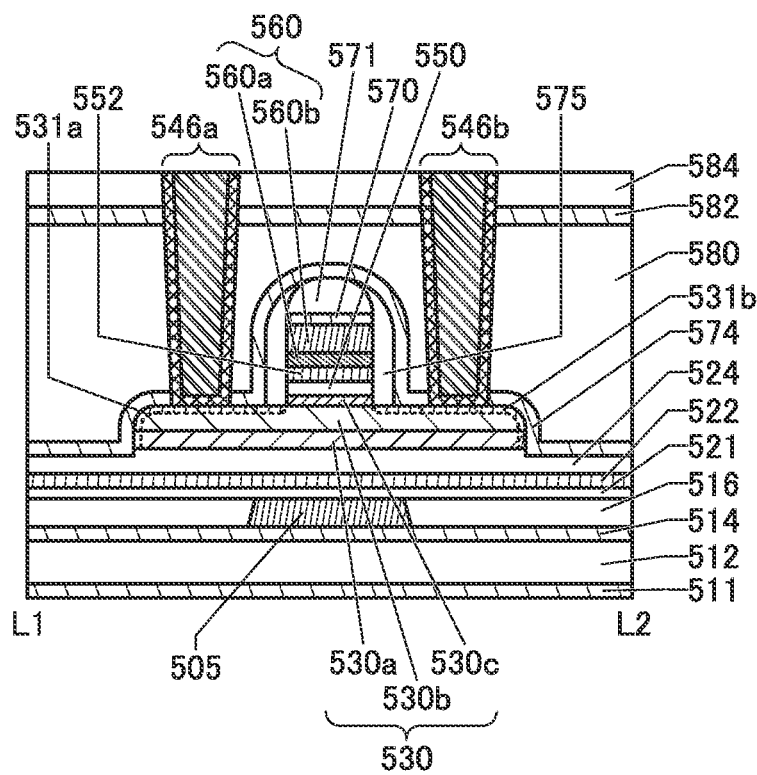
FIG. 12B is a cross-sectional view illustrating a structure example of a transistor.

A structure example of a transistor 510D is described with reference to FIG. 12A, FIG. 12B, and FIG. 12C. FIG. 12A is a top view of the transistor 510D. FIG. 12B is a cross-sectional view of a portion indicated by a dashed-dotted line L1-L2 in FIG. 12A. FIG. 12C is a cross-sectional view of a portion indicated by a dashed-dotted line W1-W2 in FIG. 12A. Note that for clarification of the drawing, some components are not illustrated in the top view of FIG. 12A.

The transistor 510D is a variation example of the above transistors. Therefore, differences from the above transistors are mainly described to avoid repeated description.

In FIG. 12A to FIG. 12C, the conductor 503 is not provided and the conductor 505 that has a function of a second gate is made to function also as a wiring. Furthermore, the insulator 550 is provided over the oxide 530c and a metal oxide 552 is provided over the insulator 550. The conductor 560 is provided over the metal oxide 552, and an insulator 570 is provided over the conductor 560. An insulator 571 is provided over the insulator 570.

The metal oxide 552 preferably has a function of inhibiting diffusion of oxygen. When the metal oxide 552 that inhibits oxygen diffusion is provided between the insulator 550 and the conductor 560, diffusion of oxygen into the conductor 560 is inhibited. That is, a reduction in the amount of oxygen supplied to the oxide 530 can be inhibited. Moreover, oxidization of the conductor 560 due to oxygen can be suppressed.

Note that the metal oxide 552 may function as part of a first gate. For example, an oxide semiconductor that can be used for the oxide 530 can be used for the metal oxide 552. In this case, when the conductor 560 is deposited by a sputtering method, the metal oxide 552 can have a reduced electric resistance value to be a conductive layer. This can be called an OC (Oxide Conductor) electrode.

The metal oxide 552 functions as part of a gate insulating film in some cases. Thus, when silicon oxide, silicon oxynitride, or the like is used for the insulator 550, a metal oxide that is a high-k material with a high relative permittivity is preferably used for the metal oxide 552. Such a stacked-layer structure can be thermally stable and can have a high relative permittivity. Thus, a gate potential that is applied during operation of the transistor can be reduced while the physical thickness is maintained. In addition, the equivalent oxide thickness (EOT) of the insulating layer functioning as the gate insulating film can be reduced.

Although the metal oxide 552 in the transistor 510D is shown as a single layer, the metal oxide 552 may have a stacked-layer structure of two or more layers. For example, a metal oxide functioning as part of a gate electrode and a metal oxide functioning as part of the gate insulating film may be stacked.

With the metal oxide 552 functioning as a gate electrode, the on-state current of the transistor 510D can be increased without a reduction in the influence of the electric field from the conductor 560. With the metal oxide 552 functioning as the gate insulating film, the distance between the conductor 560 and the oxide 530 is kept by the physical thicknesses of the insulator 550 and the metal oxide 552, so that leakage current between the conductor 560 and the oxide 530 can be reduced. Thus, with the stacked-layer structure of the insulator 550 and the metal oxide 552, the physical distance between the conductor 560 and the oxide 530 and the intensity of electric field applied from the conductor 560 to the oxide 530 can be easily adjusted as appropriate.

Specifically, the oxide semiconductor that can be used for the oxide 530 can also be used for the metal oxide 552 when the resistance thereof is reduced. Alternatively, a metal oxide containing one kind or two or more kinds selected from hafnium, aluminum, gallium, yttrium, zirconium, tungsten, titanium, tantalum, nickel, germanium, magnesium, and the like can be used.

It is particularly preferable to use an insulating layer containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable since it is less likely to be crystallized by heat treatment in a later step. Note that the metal oxide 552 is not an essential structure. Design is appropriately set in consideration of required transistor characteristics.

For the insulator 570, an insulating material having a function of inhibiting the passage of oxygen and impurities such as water and hydrogen is preferably used. For example, aluminum oxide or hafnium oxide is preferably used. Thus, oxidization of the conductor 560 due to oxygen from above the insulator 570 can be inhibited. Moreover, entry of impurities such as water and hydrogen from above the insulator 570 into the oxide 530 through the conductor 560 and the insulator 550 can be inhibited.

The insulator 571 functions as a hard mask. By providing the insulator 571, the conductor 560 can be processed to have a side surface that is substantially vertical; specifically, an angle formed by the side surface of the conductor 560 and a surface of the substrate can be greater than or equal to 75° and less than or equal to 100°, preferably greater than or equal to 80° and less than or equal to 95°.

An insulating material having a function of inhibiting the passage of oxygen and impurities such as water and hydrogen may be used for the insulator 571 so that the insulator 571 also functions as a barrier layer. In that case, the insulator 570 does not have to be provided.

Parts of the insulator 570, the conductor 560, the metal oxide 552, the insulator 550, and the oxide 530c are selected and removed using the insulator 571 as a hard mask, whereby their side surfaces can be substantially aligned with each other and a surface of the oxide 530b can be partly exposed.

The transistor 510D includes a region 531a and a region 531b on part of the exposed surface of the oxide 530b. One of the region 531a and the region 531b functions as a source region, and the other functions as a drain region.

The region 531a and the region 531b can be formed by addition of an impurity element such as phosphorus or boron to the exposed surface of the oxide 530b by an ion implantation method, an ion doping method, a plasma immersion ion implantation method, or plasma treatment, for example. In this embodiment and the like, an "impurity element" refers to an element other than main constituent elements.

Alternatively, the region 531a and the region 531b can be formed in such manner that, after part of the surface of the oxide 530b is exposed, a metal film is formed and then heat treatment is performed so that the element contained in the metal film is diffused into the oxide 530b.

The electrical resistivity of regions of the oxide 530b to which the impurity element is added decreases. For that reason, the region 531a and the region 531b are sometimes referred to "impurity regions" or "low-resistance regions".

The region 531a and the region 531b can be formed in a self-aligned manner by using the insulator 571 and/or the conductor 560 as a mask. Accordingly, the conductor 560 does not overlap with the region 531a and/or the region 531b, so that the parasitic capacitance can be reduced. Moreover, an offset region is not formed between a channel formation region and the source/drain region (the region 531a or the region 531b). The formation of the region 531a and the region 531b in a self-aligned manner achieves an increase in on-state current, a reduction in threshold voltage, and an improvement in operating frequency, for example.

Note that an offset region may be provided between the channel formation region and the source/drain region in order to further reduce the off-state current. The offset region is a region where the electrical resistivity is high and a region where the above-described addition of the impurity element is not performed. The offset region can be formed by the above-described addition of the impurity element after the formation of an insulator 575. In this case, the insulator 575 serves as a mask like the insulator 571 or the like. Thus, the impurity element is not added to a region of the oxide 530b overlapped by the insulator 575, so that the electrical resistivity of the region can be kept high.

The transistor 510D includes the insulator 575 on the side surfaces of the insulator 570, the conductor 560, the metal oxide 552, the insulator 550, and the oxide 530c. The insulator 575 is preferably an insulator having a low relative permittivity. For example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like is preferably used. In particular, silicon oxide, silicon oxynitride, silicon nitride oxide, or porous silicon oxide is preferably used for the insulator 575, in which case an excess-oxygen region can be easily formed in the insulator 575 in a later step. Silicon oxide and silicon oxynitride are preferable because of their thermal stability. The insulator 575 preferably has a function of diffusing oxygen.

The transistor 510D also includes the insulator 574 over the insulator 575 and the oxide 530. The insulator 574 is preferably deposited by a sputtering method. When a sputtering method is used, an insulator containing few impurities such as water and hydrogen can be deposited. For example, aluminum oxide is preferably used for the insulator 574.

Note that an oxide film obtained by a sputtering method may extract hydrogen from the structure body over which the oxide film is deposited. Thus, the hydrogen concentration in the oxide 530 and the insulator 575 can be reduced when the insulator 574 absorbs hydrogen and water from the oxide 530 and the insulator 575.

<Transistor Structure Example 5>

Figure 13A:
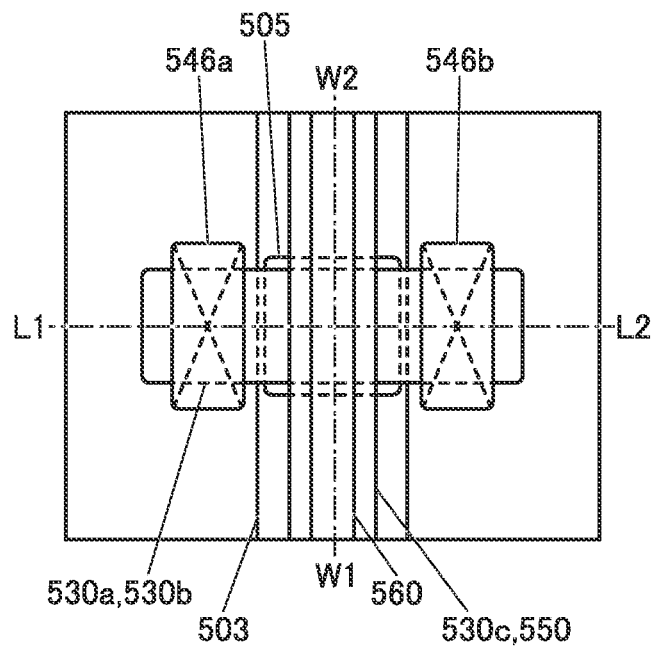
FIG. 13A is a top view illustrating a structure example of a transistor.
Figure 13C:
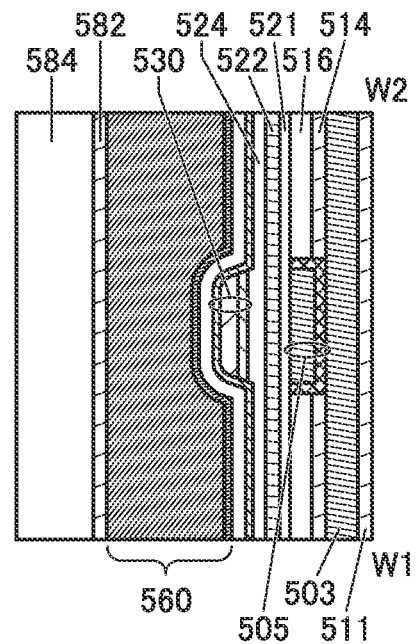
FIG. 13C is a cross-sectional view illustrating a structure example of a transistor.
Figure 13B:
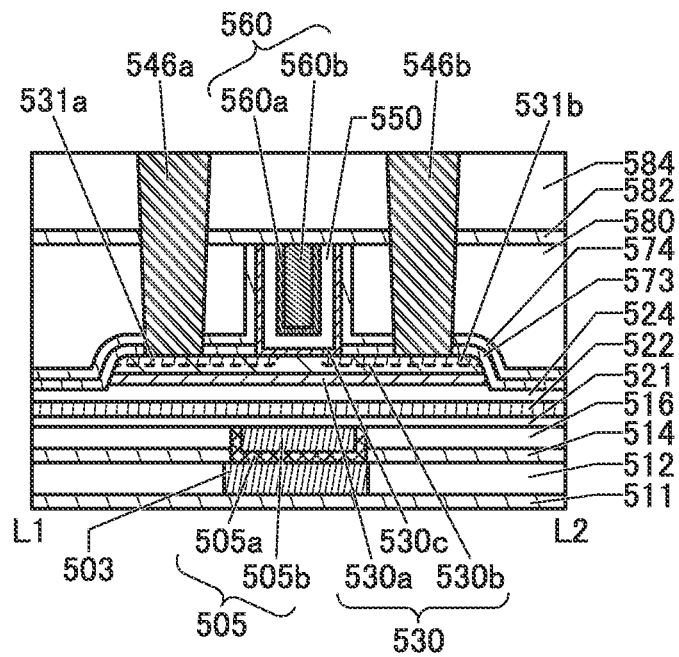
FIG. 13B is a cross-sectional view illustrating a structure example of a transistor.

A structure example of a transistor 510E is described with reference to FIG. 13A to FIG. 13C. FIG. 13A is a top view of the transistor 510E. FIG. 13B is a cross-sectional view of a portion indicated by a dashed-dotted line L1-L2 in FIG. 13A. FIG. 13C is a cross-sectional view of a portion indicated by a dashed-dotted line W1-W2 in FIG. 13A. Note that for clarification of the drawing, some components are not illustrated in the top view of FIG. 13A.

The transistor 510E is a variation example of the above transistors. Therefore, differences from the above transistors are mainly described to avoid repeated description.

In FIG. 13A to FIG. 13C, the conductor 542 is not provided, and part of the exposed surface of the oxide 530b includes the region 531a and the region 531b. One of the region 531a and the region 531b functions as a source region, and the other functions as a drain region. Moreover, an insulator 573 is included between the oxide 530b and the insulator 574.

The regions 531 (the region 531a and the region 531b) illustrated in FIG. 13A, FIG. 13B, and FIG. 13C are regions where an element to be described below is added to the oxide 530b. The regions 531 can be formed with the use of a dummy gate, for example.

Specifically, a dummy gate is provided over the oxide 530b, and the above element that reduces the resistance of the oxide 530b is added using the dummy gate as a mask. That is, the element is added to regions of the oxide 530 that are not overlapped by the dummy gate, whereby the regions 531 are formed. As a method of adding the element, an ion implantation method by which an ionized source gas is subjected to mass separation and then added, an ion doping method by which an ionized source gas is added without mass separation, a plasma immersion ion implantation method, or the like can be used.

Typical examples of the element that reduces the resistance of the oxide 530 are boron and phosphorus. Moreover, hydrogen, carbon, nitrogen, fluorine, sulfur, chlorine, titanium, a rare gas element, or the like may be used. Typical examples of the rare gas element include helium, neon, argon, krypton, and xenon. The concentration of the element is measured by secondary ion mass spectrometry (SIMS) or the like.

In particular, boron and phosphorus are preferable because an apparatus used in a manufacturing line for amorphous silicon or low-temperature polysilicon can be used. Since the existing facility can be used, capital investment can be reduced.

Next, an insulating film to be the insulator 573 and an insulating film to be the insulator 574 may be formed over the oxide 530b and the dummy gate. Stacking the insulating film to be the insulator 573 and the insulating film to be the insulator 574 can provide a region where the region 531, the oxide 530c, and the insulator 550 overlap with each other.

Specifically, after an insulating film to be the insulator 580 is provided over the insulating film to be the insulator 574, the insulating film to be the insulator 580 is subjected to CMP (Chemical Mechanical Polishing) treatment, whereby part of the insulating film to be the insulator 580 is removed and the dummy gate is exposed. Then, when the dummy gate is removed, part of the insulator 573 in contact with the dummy gate is preferably also removed. Thus, the insulator 574 and the insulator 573 are exposed at a side surface of an opening provided in the insulator 580, and the region 531 provided in the oxide 530b is partly exposed at the bottom surface of the opening. Next, an oxide film to be the oxide 530c, an insulating film to be the insulator 550, and a conductive film to be the conductor 560 are formed in this order in the opening, and then an oxide film to be the oxide 530c, an insulating film to be the insulator 550, and a conductive film to be the conductor 560 are partly removed by CMP treatment or the like until the insulator 580 is exposed; thus, the transistor illustrated in FIG. 13A, FIG. 13B, and FIG. 13C can be formed.

Note that the insulator 573 and the insulator 574 are not essential components. Design is appropriately set in consideration of required transistor characteristics.

The cost of the transistor illustrated in FIG. 13A, FIG. 13B, and FIG. 13C can be reduced because an existing apparatus can be used and the conductor 542 is not provided.

<Transistor Structure Example 6>

Figure 14A:
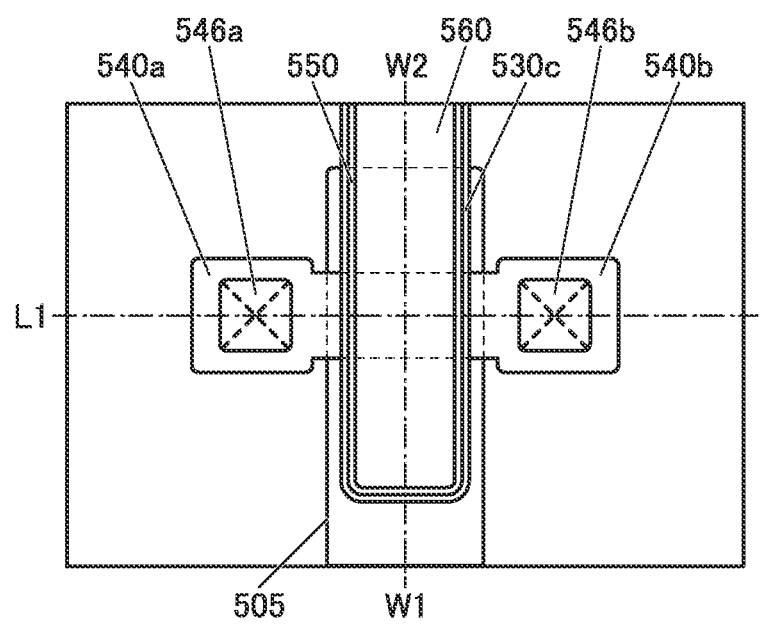
FIG. 14A is a top view illustrating a structure example of a transistor.
Figure 14C:
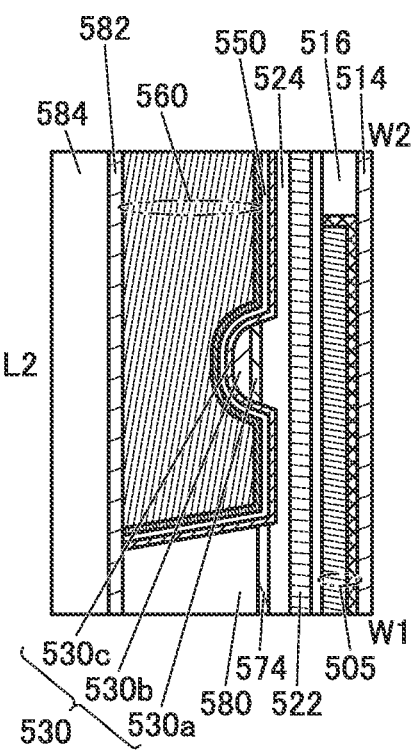
FIG. 14C is a cross-sectional view illustrating a structure example of a transistor.
Figure 14B:
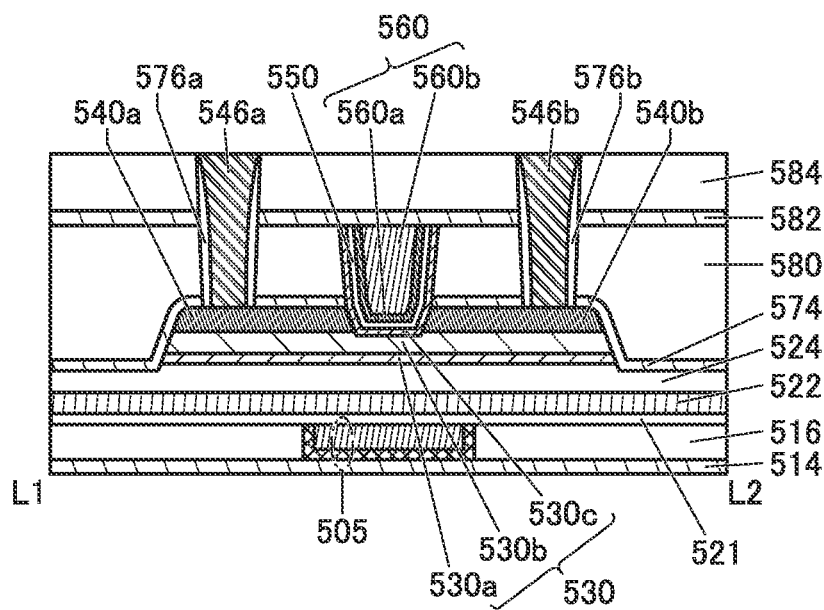
FIG. 14B is a cross-sectional view illustrating a structure example of a transistor.

A structure example of a transistor 510F is described with reference to FIG. 14A to FIG. 14C. FIG. 14A is a top view of the transistor 510F. FIG. 14B is a cross-sectional view of a portion indicated by a dashed-dotted line L1-L2 in FIG. 14A. FIG. 14C is a cross-sectional view of a portion indicated by a dashed-dotted line W1-W2 in FIG. 14A. Note that for clarification of the drawing, some components are not illustrated in the top view of FIG. 14A.

The transistor 510F is a variation example of the transistor 510A. Therefore, differences from the above transistors are mainly described to avoid repeated description.

In the transistor 510A, part of the insulator 574 is provided in the opening provided in the insulator 580 to cover a side surface of the conductor 560. Meanwhile, in the transistor 510F, an opening is formed by partly removing the insulator 580 and the insulator 574.

An insulator 576 (an insulator 576a and an insulator 576b) having a barrier property may be provided between the conductor 546 and the insulator 580. Providing the insulator 576 can prevent oxygen in the insulator 580 from reacting with the conductor 546 and oxidizing the conductor 546.

Note that when an oxide semiconductor is used as the oxide 530, the oxide 530 preferably has a stacked-layer structure of a plurality of oxide layers that differ in the atomic ratio of metal atoms. Specifically, the atomic proportion of the element M in constituent elements in the metal oxide used for the oxide 530a is preferably greater than the atomic proportion of the element M in constituent elements in the metal oxide used for the oxide 530b. Moreover, the atomic ratio of the element M to In in the metal oxide used for the oxide 530a is preferably greater than the atomic ratio of the element M to In in the metal oxide used for the oxide 530b. Furthermore, the atomic ratio of In to the element M in the metal oxide used for the oxide 530b is preferably greater than the atomic ratio of In to the element M in the metal oxide used for the oxide 530a. A metal oxide that can be used for the oxide 530a or the oxide 530b can be used for the oxide 530c.

The oxide 530a, the oxide 530b, and the oxide 530c preferably have crystallinity, and in particular, it is preferable to use a CAAC-OS. An oxide having crystallinity, such as a CAAC-OS, has a dense structure with small amounts of impurities and defects (e.g., oxygen vacancies) and high crystallinity. This can inhibit extraction of oxygen from the oxide 530b by the source electrode or the drain electrode. This can reduce extraction of oxygen from the oxide 530b even when heat treatment is performed; hence, the transistor 510F is stable against high temperatures in the manufacturing process (what is called thermal budget).

Note that one or both of the oxide 530a and the oxide 530c may be omitted. The oxide 530 may be a single layer of the oxide 530b. In the case where the oxide 530 is a stack of the oxide 530a, the oxide 530b, and the oxide 530c, the energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b. In that case, for the oxide 530c, a metal oxide that can be used for the oxide 530a is preferably used. Specifically, the atomic ratio of the element M to the constituent elements in the metal oxide used as the oxide 530c is preferably greater than the atomic ratio of the element M to the constituent elements in the metal oxide used as the oxide 530b. Moreover, the atomic ratio of the element M to In in the metal oxide used as the oxide 530c is preferably greater than the atomic ratio of the element M to In in the metal oxide used as the oxide 530b. Furthermore, the atomic ratio of In to the element M in the metal oxide used as the oxide 530b is preferably greater than the atomic ratio of In to the element M in the metal oxide used as the oxide 530c.

The energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To obtain this, the density of defect states in a mixed layer formed at an interface between the oxide 530a and the oxide 530b and an interface between the oxide 530b and the oxide 530c is preferably made low.

Specifically, when the oxide 530a and the oxide 530b or the oxide 530b and the oxide 530c contain the same element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is preferably used for the oxide 530a and the oxide 530c. In addition, the oxide 530c may have a stacked-layer structure. For example, it is possible to employ a stacked-layer structure of an In—Ga—Zn oxide and a Ga—Zn oxide over the In—Ga—Zn oxide, or a stacked-layer structure of an In—Ga—Zn oxide and gallium oxide over the In—Ga—Zn oxide. In other words, a stacked-layer structure of an In—Ga—Zn oxide and an oxide that does not contain In may be employed as the oxide 530c.

Specifically, as the oxide 530a, a metal oxide having In:Ga:Zn=1:3:4 [atomic ratio] or a composition in the vicinity thereof, or 1:1:0.5 [atomic ratio] or a composition in the vicinity thereof is used. As the oxide 530b, a metal oxide having In:Ga:Zn=1:1:1 [atomic ratio] or a composition in the vicinity thereof, In:Ga:Zn=4:2:3 [atomic ratio] or a composition in the vicinity thereof, In:Ga:Zn=5:1:3 [atomic ratio] or a composition in the vicinity thereof, or 10:1:3 [atomic ratio] or a composition in the vicinity thereof or an In—Zn oxide is used. A metal oxide that can be used as the oxide 530a or the oxide 530b may be used as the oxide 530c. Note that a composition in the vicinity includes ±30% of an intended atomic ratio.

The oxide 530c may have a stacked-layer structure of two or more layers. As a specific example of the case where the oxide 530c has a stacked-layer structure, a metal oxide having In:Ga:Zn=5:1:3 [atomic ratio] or a composition in the vicinity thereof, or 10:1:3 [atomic ratio] or a composition in the vicinity thereof or an In—Zn oxide is used as a lower layer of the oxide 530c, and a metal oxide having In:Ga:Zn=1:3:4 [atomic ratio] or a composition in the vicinity thereof, Ga:Zn=2:1 [atomic ratio] or a composition in the vicinity thereof, or Ga:Zn=2:5 [atomic ratio] or a composition in the vicinity thereof or gallium oxide is used as an upper layer of the oxide 530c.

When the oxide 530a and the oxide 530c have the above structure, the density of defect states at the interface between the oxide 530a and the oxide 530b and the interface between the oxide 530b and the oxide 530c can be made low. Thus, the influence of interface scattering on carrier conduction is small, and the transistor 510F can have high on-state current and high frequency characteristics. Note that in the case where the oxide 530c has a stacked-layer structure, in addition to the effect of reducing the density of defect states at the interface between the oxide 530b and the oxide 530c, the effect of inhibiting diffusion of the constituent element of the oxide 530c to the insulator 550 side is expected. More specifically, the oxide 530c has a stacked-layer structure and the oxide that does not contain In is positioned at the upper part of the stacked-layer structure, whereby In can be inhibited from being diffused into the insulator 550 side. Since the insulator 550 functions as the gate insulator, the transistor has defects in characteristics when In diffuses. Thus, when the oxide 530c has a stacked-layer structure, a highly reliable semiconductor device can be provided.

A metal oxide functioning as an oxide semiconductor is preferably used as the oxide 530. For example, as the metal oxide to be the channel formation region in the oxide 530, a metal oxide having a bandgap of 2 eV or more, preferably 2.5 eV or more is preferably used. With the use of a metal oxide having such a wide bandgap, the off-state current of the transistor can be reduced. With the use of such a transistor, a semiconductor device with low power consumption can be provided.

<Structure Example 2 of Semiconductor Device>

Figure 15:
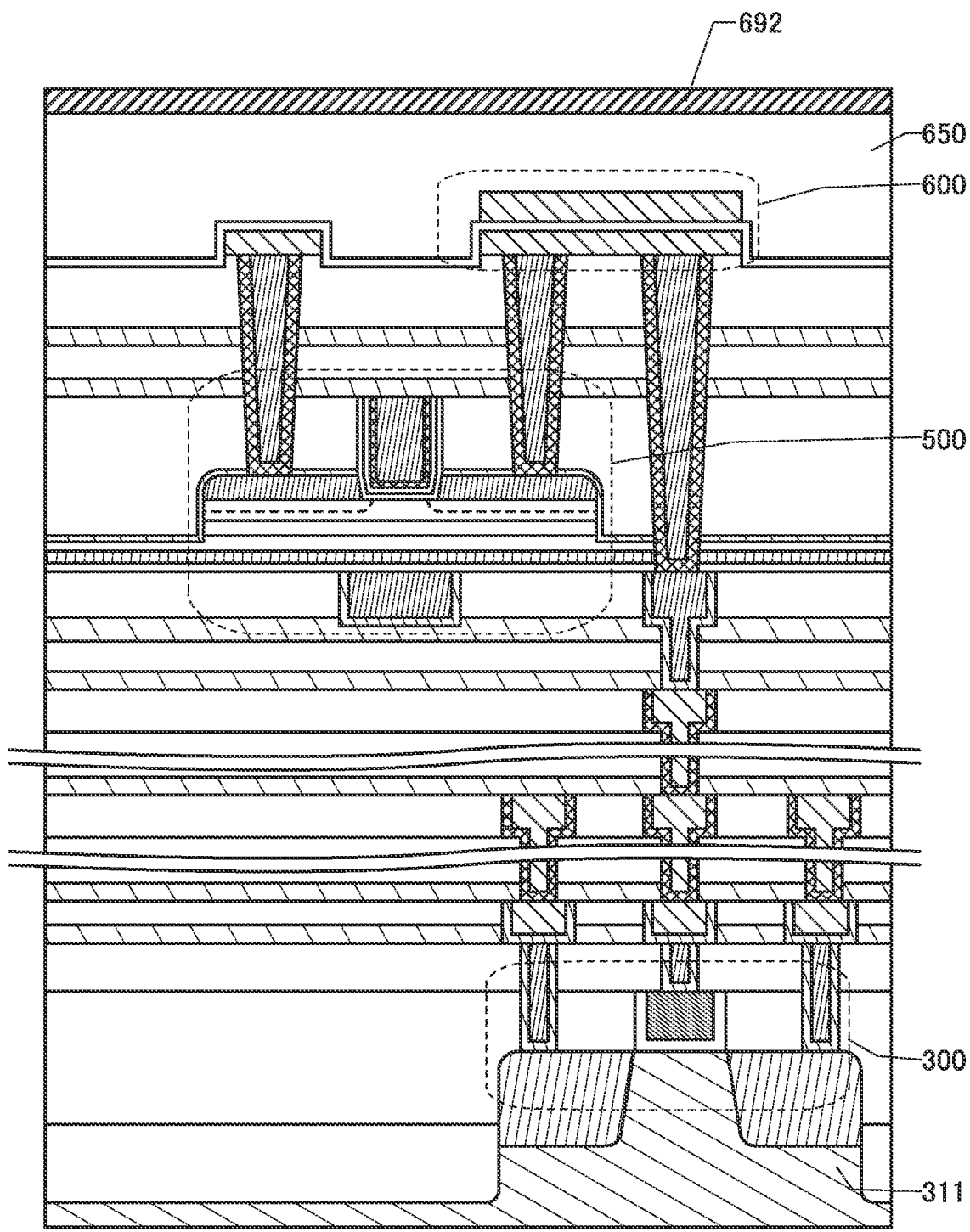
FIG. 15 is a cross-sectional view illustrating a structure example of a semiconductor device.

FIG. 15 illustrates an example in which the semiconductor device illustrated in FIG. 7 includes a conductor 692 over the insulator 650. The conductor 692 is formed to cover one surface of the semiconductor device. Although not illustrated in FIG. 15, the conductor 692 may have an opening. A conductor electrically connected to a conductor in a lower layer than the insulator 650 may be provided in the opening.

For the conductor 692, a metal can be used. A metal nitride or a metal oxide that has conductivity may be used. For the conductor 692, for example, titanium, titanium nitride, titanium oxide, or the like can be used. The conductor 692 has a function of cutting off or weakening an electromagnetic wave from the outside of the semiconductor device. Furthermore, the conductor 692 has a function of diffusing and releasing static electricity or preventing localization of electric charge. Providing the conductor 692 enables more stable operation of the semiconductor device.

Figure 16:
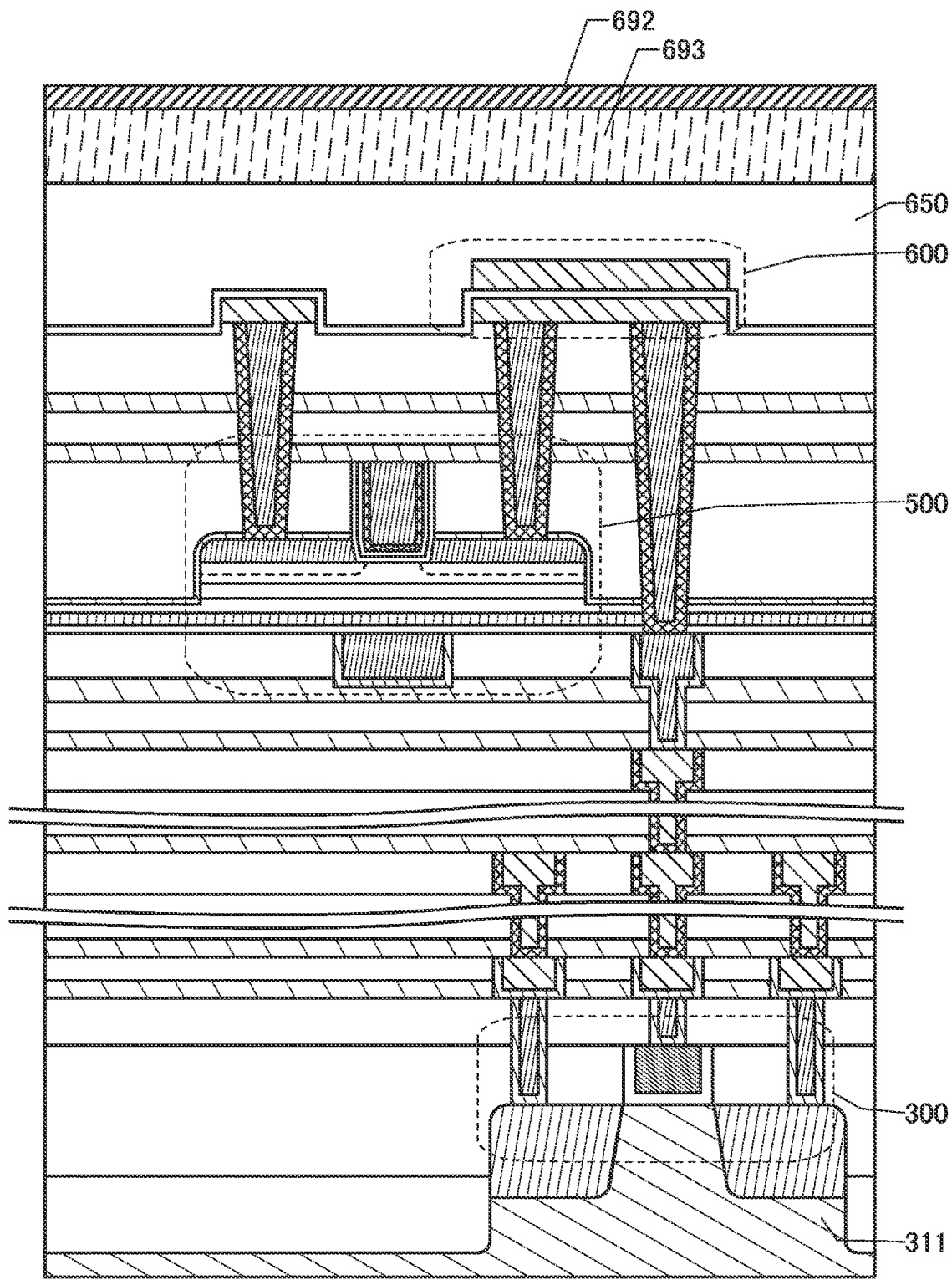
FIG. 16 is a cross-sectional view illustrating a structure example of a semiconductor device.

FIG. 16 illustrates an example in which an insulator 693 is included between the insulator 650 and the conductor 692. For the insulator 693, a structural body in which a fibrous body is impregnated with an organic resin can be used, for example. A glass fiber may be used as the fibrous body, for example. A brominated epoxy resin may be used as the organic resin, for example.

Note that this embodiment can be implemented in combination with the other embodiments described in this specification as appropriate.

Embodiment 3

In this embodiment, the composition of a metal oxide that can be used in the OS transistor described in the above embodiment is described.

<<Metal Oxide>>

As the oxide 530, a metal oxide functioning as an oxide semiconductor is preferably used. A metal oxide that can be used as the oxide 530 according to the present invention is described below.

The metal oxide contains preferably at least indium or zinc and particularly preferably indium and zinc. In addition, gallium, yttrium, tin, or the like is preferably contained. Furthermore, one or more elements selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide that contains indium, an element M, and zinc is considered. The element M is aluminum, gallium, yttrium, or tin. Other elements that can be used as the element M include boron, titanium, iron, nickel, germanium, zirconium, molybdenum, lanthanum, cerium, neodymium, hafnium, tantalum, tungsten, and magnesium. Note that two or more of the above elements may be used in combination as the element M.

Note that in this specification and the like, a metal oxide containing nitrogen is also referred to as a metal oxide in some cases. Moreover, a metal oxide containing nitrogen may be referred to as a metal oxynitride.

[Structure of Metal Oxide]

Oxide semiconductors (metal oxides) can be classified into a single crystal oxide semiconductor and a non-single-crystal oxide semiconductor. Examples of a non-single-crystal oxide semiconductor include a CAAC-OS, a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the nanocrystals are connected.

The shape of the nanocrystal is basically a hexagon but is not always a regular hexagon and is a non-regular hexagon in some cases. A pentagonal lattice arrangement, a heptagonal lattice arrangement, and the like are included in the distortion in some cases. Note that it is difficult to observe a clear crystal grain boundary (also referred to as grain boundary) even in the vicinity of distortion in the CAAC-OS. That is, a lattice arrangement is distorted and thus formation of a crystal grain boundary is inhibited. This is because the CAAC-OS can tolerate distortion owing to a low density of oxygen atom arrangement in the a-b plane direction, a change in interatomic bond distance by substitution of a metal element, and the like.

The CAAC-OS tends to have a layered crystal structure (also referred to as a stacked-layer structure) in which a layer containing indium and oxygen (hereinafter an In layer) and a layer containing the element M, zinc, and oxygen (hereinafter an (M, Zn) layer) are stacked. Note that indium and the element M can be replaced with each other, and when the element M of the (M, Zn) layer is replaced with indium, the layer can be referred to as an (In, M, Zn) layer. When indium of the In layer is replaced with the element M, the layer can be referred to as an (In, M) layer.

The CAAC-OS is a metal oxide with high crystallinity. By contrast, in the CAAC-OS, a reduction in electron mobility due to a crystal grain boundary is less likely to occur because it is difficult to observe a clear crystal grain boundary. Entry of impurities, formation of defects, or the like might decrease the crystallinity of a metal oxide. This means that the CAAC-OS is a metal oxide having small amounts of impurities and defects (e.g., oxygen vacancies). Thus, a metal oxide including the CAAC-OS is physically stable. Accordingly, the metal oxide including the CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation in the whole film is not observed. Accordingly, in some cases, the nc-OS cannot be distinguished from an a-like OS or an amorphous oxide semiconductor, depending on an analysis method.

Note that an In—Ga—Zn oxide (hereinafter IGZO) that is a metal oxide containing indium, gallium, and zinc has a stable structure in some cases by being formed of the above-described nanocrystals. In particular, IGZO crystals tend not to grow in the air and thus, a stable structure is obtained when IGZO is formed of smaller crystals (e.g., the above-described nanocrystals) rather than larger crystals (here, crystals with a size of several millimeters or several centimeters).

The a-like OS is a metal oxide having a structure between those of the nc-OS and the amorphous oxide semiconductor. The a-like OS has a void or a low-density region. That is, the a-like OS has low crystallinity as compared with the nc-OS and the CAAC-OS.

An oxide semiconductor (metal oxide) can have any of various structures that show various different properties. Two or more of the amorphous oxide semiconductor, the polycrystalline oxide semiconductor, the a-like OS, the nc-OS, and the CAAC-OS may be included in an oxide semiconductor of one embodiment of the present invention.

[Impurities]

Here, the influence of impurities in the metal oxide is described.

Entry of impurities into the oxide semiconductor forms defect states or oxygen vacancies in some cases. Thus, when impurities enter a channel formation region of the oxide semiconductor, the electrical characteristics of a transistor using the oxide semiconductor tend to vary and its reliability is degraded in some cases. Moreover, if the channel formation region includes oxygen vacancies, the transistor tends to have normally-on characteristics.

The above-described defect states may include a trap state. Charge trapped by a trap state in the metal oxide takes a long time to disappear and may behave like fixed charge. Thus, a transistor including the metal oxide having a high density of trap states in the channel formation region has unstable electrical characteristics in some cases.

If impurities exist in the channel formation region of the oxide semiconductor, the crystallinity of the channel formation region may decrease, and the crystallinity of an oxide in contact with the channel formation region may decrease. Low crystallinity of the channel formation region tends to result in deterioration in stability or reliability of the transistor. Moreover, if the crystallinity of the oxide in contact with the channel formation region is low, an interface state may be formed and the stability or reliability of the transistor may deteriorate.

Therefore, the reduction in concentration of impurities in and around the channel formation region of the oxide semiconductor is effective in improving the stability or reliability of the transistor. Examples of impurities include hydrogen, nitrogen, alkali metal, alkaline earth metal, iron, nickel, and silicon.

Specifically, the concentration of the above impurities obtained by SIMS is lower than or equal to $1\times10^{18}$ atoms/cm$^3$, preferably lower than or equal to $2\times10^{16}$ atoms/cm$^3$ in and around the channel formation region of the oxide semiconductor. Alternatively, the concentration of the above impurities obtained by element analysis using EDX is lower than or equal to 1.0 at. % in and around the channel formation region of the oxide semiconductor. When an oxide containing the element M is used as the oxide semiconductor, the concentration ratio of the impurities to the element M is lower than 0.10, preferably lower than 0.05 in and around the channel formation region of the oxide semiconductor. Here, the concentration of the element M used in the calculation of the concentration ratio may be a concentration in a region that is the same as the region whose concertation of the impurities is calculated or may be a concentration in the oxide semiconductor.

A metal oxide with a low impurity concentration has a low density of defect states and thus has a low density of trap states in some cases.

In the case where hydrogen enters an oxygen vacancy in the metal oxide, the oxygen vacancy and the hydrogen are bonded to each other to form VoH in some cases. The VoH serves as a donor and an electron that is a carrier is generated in some cases. In other cases, bonding of part of hydrogen to oxygen bonded to a metal atom generates an electron serving as a carrier.

Thus, a transistor including an oxide semiconductor with a high hydrogen content is likely to be normally on. Hydrogen in the oxide semiconductor is easily transferred by a stress such as heat or an electric field; thus, a high hydrogen content in the oxide semiconductor might reduce the reliability of the transistor.

Accordingly, the amount of VoH in the metal oxide is preferably reduced as much as possible so that the oxide semiconductor becomes a highly purified intrinsic or substantially highly purified intrinsic oxide semiconductor. In order to obtain such an oxide semiconductor with a sufficiently small amount of VoH, it is important to remove impurities such as moisture and hydrogen in the oxide semiconductor (this treatment is sometimes referred to as dehydration or dehydrogenation treatment) and supply oxygen to the oxide semiconductor to fill oxygen vacancies (this treatment is sometimes referred to as oxygen adding treatment). When an oxide semiconductor with sufficiently small amounts of impurities such as VoH is used for a channel formation region of a transistor, the transistor can have stable electrical characteristics.

An oxide semiconductor with a low carrier concentration is preferably used for the transistor. In order to reduce the carrier concentration of the oxide semiconductor, the concentration of impurities in the oxide semiconductor is reduced so that the density of defect states can be reduced. In this specification and the like, a state with a low concentration of impurities and a low density of defect states is referred to as a highly purified intrinsic or substantially highly purified intrinsic state. Examples of impurities contained in the oxide semiconductor include hydrogen, nitrogen, alkali metal, alkaline earth metal, iron, nickel, and silicon.

Specifically, hydrogen contained in an oxide semiconductor reacts with oxygen bonded to a metal atom to be water, and thus sometimes causes an oxygen vacancy in the oxide semiconductor. If the channel formation region in the oxide semiconductor includes oxygen vacancies, the transistor sometimes has normally-on characteristics. In some cases, a defect that is an oxygen vacancy into which hydrogen enters functions as a donor and generates an electron serving as a carrier. In other cases, bonding of part of hydrogen to oxygen bonded to a metal atom generates an electron serving as a carrier. Thus, a transistor including an oxide semiconductor that contains a large amount of hydrogen is likely to have normally-on characteristics.

A defect that is an oxygen vacancy into which hydrogen enters (VoH) serves as donors of the oxide semiconductor in some cases; however, it is difficult to quantitatively evaluate the defects. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" in this specification and the like can be replaced with "donor concentration" in some cases.

Therefore, hydrogen in the oxide semiconductor is preferably reduced as much as possible. Specifically, the hydrogen concentration of the oxide semiconductor, which is measured by secondary ion mass spectrometry (SIMS), is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When an oxide semiconductor with a sufficiently low concentration of impurities such as hydrogen is used for a channel formation region of a transistor, the transistor can have stable electrical characteristics.

The carrier concentration of the oxide semiconductor in the channel formation region is preferably lower than or equal to $1\times10^{18}$ cm$^{-3}$, further preferably lower than $1\times10^{17}$ cm$^{-3}$, still further preferably lower than $1\times10^{16}$ cm$^{-3}$, yet further preferably lower than $1\times10^{13}$ cm$^{-3}$, and yet still further preferably lower than $1\times10^{12}$ cm$^{-3}$. Note that the lower limit of the carrier concentration of the oxide semiconductor in the channel formation region is not particularly limited and can be, for example, $1\times10^{-9}$ cm$^{-3}$.

One embodiment of the present invention can provide a highly reliable semiconductor device. One embodiment of the present invention can provide a semiconductor device with favorable electrical characteristics. One embodiment of the present invention can provide a semiconductor device with a high on-state current. One embodiment of the present invention can provide a miniaturized or highly integrated semiconductor device. One object of one embodiment of the present invention is to provide a semiconductor device with low power consumption.

<<Other Semiconductor Materials>>

A semiconductor material that can be used for the oxide 530 is not limited to the above metal oxides. A semiconductor material having a band gap (a semiconductor material that is not a zero-gap semiconductor) may be used for the oxide 530. For example, a single element semiconductor such as silicon, a compound semiconductor such as gallium arsenide, or a layered material functioning as a semiconductor (also referred to as an atomic layer material, a two-dimensional material, or the like) is preferably used as the semiconductor material. The layered material functioning as a semiconductor is particularly suitable as the semiconductor material.

Here, in this specification and the like, the layered material generally refers to a group of materials having a layered crystal structure. The layered crystal structure refers to a structure in which layers formed by a covalent bond or an ionic bond are stacked with a bond that is weaker than the covalent bond or the ionic bond, such as a van der Waals force. The layered material has high electrical conductivity in a monolayer, that is, high two-dimensional electrical conductivity. With the use of a material functioning as a semiconductor and having high two-dimensional electrical conductivity in a channel formation region, a transistor with a high on-state current can be provided.

Examples of the layered material include graphene, silicene, and chalcogenide. Chalcogenide is a compound containing chalcogen. Chalcogen is a general term of Group 16 elements such as oxygen, sulfur, selenium, tellurium, polonium, and livermorium. Examples of chalcogenide include chalcogenide of transition metals and chalcogenide of Group 13 elements.

Chalcogenide of transition metals that functions as a semiconductor is preferably used as the oxide 530, for example. Specific examples of chalcogenide of transition metals that can be used as the oxide 530 include molybdenum sulfide (typically, $MoS_2$), molybdenum selenide (typically, $MoSe_2$), molybdenum telluride (typically, $MoTe_2$), tungsten sulfide (typically, $WS_2$), tungsten selenide (typically, $WSe_2$), tungsten telluride (typically, $WTe_2$), hafnium sulfide (typically, $HfS_2$), hafnium selenide (typically, $HfSe_2$), zirconium sulfide (typically, $ZrS_2$), and zirconium selenide (typically, $ZrSe_2$).

Note that this embodiment can be implemented in combination with the other embodiments described in this specification as appropriate.

REFERENCE NUMERALS

BIAS1, IN2, INM, INPMVB, OUT, OUT2, OUTB, PVB, SET, VBCS, VBG, VCASD, VCASL, VDD, VSH, VSS, VT: terminal
ND1, ND2, ND3, ND4, ND5: node
11: amplifier circuit, 30a: circuit, 30b: circuit, 30c: circuit, 30d: circuit, 31: transistor, 32: transistor, 34: transistor, 36: transistor, 37: transistor, 41: capacitor, 42: capacitor, 45: transistor, 46: transistor, 47: transistor, 48: capacitor, 49: capacitor, 61: capacitor, 70: semiconductor device, 71: amplifier circuit, 80: amplifier circuit, 81: transistor, 82: transistor, 83: transistor, 84: transistor, 85: transistor, 86: transistor, 87: transistor, 88: capacitor, 89: resistor, 100: power storage system, 114: memory element, 121: secondary battery, 161: capacitor, 162: transistor, 300: transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 500: transistor, 503: conductor, 503a: conductor, 503b: conductor, 505: conductor, 505a: conductor, 505b: conductor, 510: insulator, 510A: transistor, 510B: transistor, 510C: transistor, 510D: transistor, 510E: transistor, 510F: transistor, 511: insulator, 512: insulator, 514: insulator, 516: insulator, 518: conductor, 520: insulator, 521: insulator, 522: insulator, 524: insulator, 530: oxide, 530a: oxide, 530b: oxide, 530c: oxide, 531: region, 531a: region, 531b: region, 540a: conductor, 540b: conductor, 542: conductor, 542a: conductor, 542b: conductor, 543: region, 543a: region, 543b: region, 544: insulator, 545: insulator, 546: conductor, 546a: conductor, 546b: conductor, 547: conductor, 547a: conductor, 547b: conductor, 548: conductor, 550: insulator, 552: metal oxide, 560: conductor, 560a: conductor, 560b: conductor, 570: insulator, 571: insulator, 573: insulator, 574: insulator, 575: insulator, 576: insulator, 576a: insulator, 576b: insulator, 580: insulator, 581: insulator, 582: insulator, 584: insulator, 586: insulator, 600: capacitor, 610: conductor, 612: conductor, 620: conductor, 630: insulator, 650: insulator, 692: conductor, 693: insulator

The invention claimed is:

1. A semiconductor device comprising:
a first amplifier circuit comprising a first output, terminal;
a capacitor; and
a second amplifier circuit comprising an input terminal, a second output terminal, a first transistor, and a second transistor,
wherein the first output terminal is electrically connected to a first electrode of the capacitor,
wherein a second electrode of the capacitor is electrically connected to a gate of the first transistor and one of a source and a drain of the second transistor through the input terminal,
wherein one of a source and a drain of the first transistor is electrically connected to the second output terminal, and
wherein a channel formation region of the second transistor comprises a metal oxide containing at least one of indium and gallium.

2. A semiconductor device comprising:
a first amplifier circuit comprising a first output, terminal;
a capacitor; and
a second amplifier circuit comprising an input terminal, a second output terminal, a first transistor, a second transistor, and a circuit,
wherein the first output terminal is electrically connected to a first electrode of the capacitor,
wherein a second electrode of the capacitor is electrically connected to a gate of the first transistor and one of a source and a drain of the second transistor through the input terminal,
wherein one of a source and a drain of the first transistor is electrically connected to the second output terminal,
wherein a channel formation region of the second transistor comprises a metal oxide containing at least one of indium and gallium,
wherein the other of the source and the drain of the first transistor is electrically connected to a low potential wiring, and wherein the circuit is electrically connected to the second output terminal and a high potential wiring.

3. The semiconductor device according to claim 2,
wherein the circuit comprises a third transistor,
wherein the second output terminal is electrically connected to one of a source and a drain of the third transistor, and
wherein the high potential wiring is electrically connected to the other of the source and the drain of the third transistor.

4. The semiconductor device according to claim 1,
wherein the other of the source and the drain of the first transistor is electrically connected to a low potential wiring.

5. The semiconductor device according to claim 1,
wherein the second amplifier circuit further comprises a resistor,
wherein one electrode of the resistor is electrically connected to the second output terminal, and
wherein the other electrode of the resistor is electrically connected to a high potential wiring.

6. The semiconductor device according to claim 2,
wherein the circuit comprises a third transistor and a fourth transistor,
wherein one of a source and a drain of the third transistor is electrically connected to the second output terminal,
wherein the other of the source and the drain of the third transistor is electrically connected to one of a source and a drain of the fourth transistor, and
wherein the other of the source and the drain of the fourth transistor is electrically connected to the high potential wiring.

\* \* \* \* \*